US006772400B2

(12) United States Patent
Tsai

(10) Patent No.: US 6,772,400 B2
(45) Date of Patent: Aug. 3, 2004

(54) SEMI-PHYSICAL MODELING OF HEMT HIGH FREQUENCY SMALL SIGNAL EQUIVALENT CIRCUIT MODELS

(75) Inventor: Roger S. Tsai, Torrance, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 0 days.

(21) Appl. No.: 09/840,600

(22) Filed: Apr. 23, 2001

(65) Prior Publication Data

US 2002/0007258 A1 Jan. 17, 2002

Related U.S. Application Data

(60) Provisional application No. 60/200,666, filed on Apr. 28, 2000.

(51) Int. Cl.[7] .............................................. G06F 17/50
(52) U.S. Cl. ................... 716/4; 716/5; 716/6
(58) Field of Search ...................................... 716/4–18

(56) References Cited

U.S. PATENT DOCUMENTS

| 5,467,291 A | 11/1995 | Fan et al. |
| 5,976,920 A | 11/1999 | Nakano et al. |
| 6,217,210 B1 | 4/2001 | Roeder et al. |

OTHER PUBLICATIONS

Mahon et al., "A Technique for Modelling S–Parameters for HEMT Structures as a Function of Gate Bias", IEEE Transactions on Microwave Theory and Techniques, vol. 40, No. 7, Jul. 1992, pp. 1430–1440.*
Hirose et al., "A Possible Scaling Limit for Enhancement–Mode GaAs MESFET's in DCFL Circuits", IEEE Transactions on Electron Devices, vol. 39, No. 12, Dec. 1992, pp. 2681–2685.*
Schroter et al., "Investigation of Very Fast and High–Current Transients in Digital Bipolar IC's using Both a New Compact Model and a Device Simulator", IEEE Journal Of Solid–State Circuits, vol. 30, No. 5, May 1995, pp. 551–562.*

Angelov et al., "A New Empirical Nonlinear Model for HEMT and MESFET Devices", IEEE Transactions on Microwave Theory and Techniques, vol. 40, No. 12, Dec. 1992, pp. 2258–2266.*
Ramakrishna, S., et al., *HEMT Modelling Using Semi–Physical Expressions for the Equilibrium Space–Charge Parameters of the Modulation–Doped Heterojunction*, IEEE, Aug. 1999, pp. 211–214.
Winson, Peter B., et al., *A Table Based Bias and Temperature Dependent Small Signal and Noise Equivalent Circuit Model*, IEEE, May 1995, pp. 623–626, entire document.
Karmalkar, Shreepad, et al., *A Simple Yet Comprehensive Unified Physical Model of the 2–D Electron Gas in Delta–Doped and Uniformly Doped High Electron Mobility Transistors*, IEEE, vol. 47, No. 1, Jan. 2000, pp. 11–23.
Francois Danneville, et al., *Noise Modeling in MESFET and HEMT Mixers Using a Uniform Noisy Line Model*, IEEE, vol. 45, No. 10, Oct. 1998, pp. 2207–2212.
Ranjit Singh, et al., *Small–Signal Characterization of Microwave and Millimeter–Wave HEMT's Based on a Physical Model*, IEEE, vol. 44, No. 1, Jan. 1996, pp. 114–121.

* cited by examiner

Primary Examiner—Thien F Tran
(74) Attorney, Agent, or Firm—Katten Muchin Zavis Rosenman; John S. Paniaguas

(57) ABSTRACT

A semi-physical device model for HEMTs that can represent known physical device characteristics and measured high frequency small signal characteristics relatively accurately. The semi-physical device model in accordance with the present invention uses analytical expressions to model the fundamental electric charge and field structure of a HEMT internal structure. These expressions are based on the device physics but are in empirical form. In this way, the model is able to maintain physical dependency with good fidelity while retaining accurate measured-to-modeled DC and small signal characteristics. The model in accordance with the present invention provides model elements for a standard small signal equivalent circuit model of FET. The model elements are derived from small signal excitation analysis of intrinsic charge and electric field as modeled within the device by the semi-physical HEMT model. As such, the RF performance can be predicted at arbitrary bias points.

16 Claims, 14 Drawing Sheets

Measured vs Modeled S-parameters
Simulated Equivalent Circuit Element Values
via Semi-Physical HEMT Model Measured vs Modeled S12
Simulated Equivalent Circuit Element Values via
Semi-Physical HEMT Model Measured vs Modeled S12
Simulated Equivalent Circuit Element Values via
Semi-Physical HEMT Model

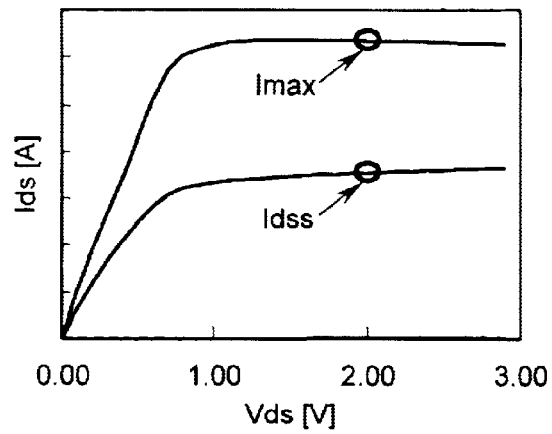
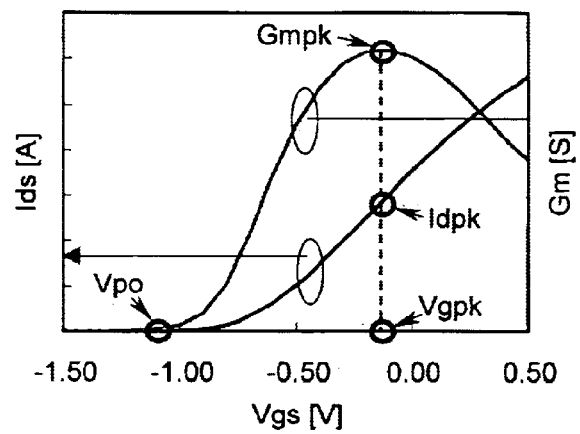
Figure 21A
Figure 21B
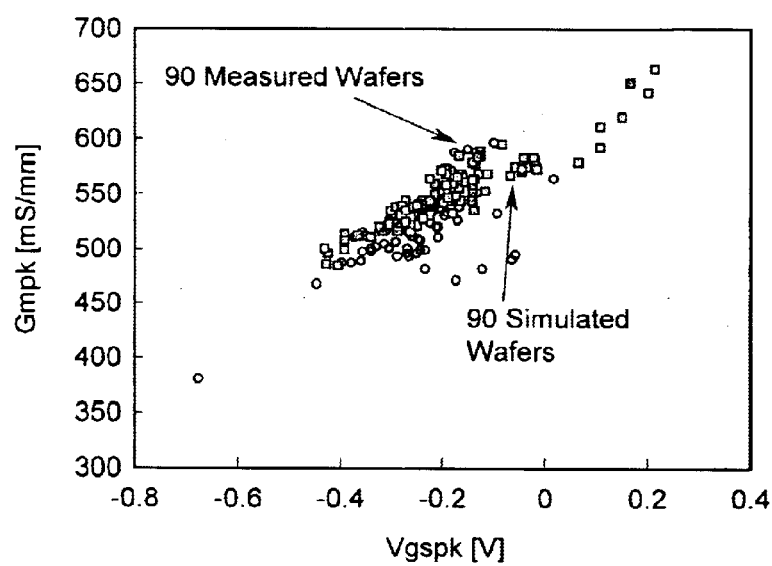
Figure 22

SEMI-PHYSICAL MODELING OF HEMT HIGH FREQUENCY SMALL SIGNAL EQUIVALENT CIRCUIT MODELS

CROSS-REFERENCE TO RELATED APPLICATIONS

This application is a continuation-in-part of and claims priority of U.S. patent application Ser. No. 60/200,666, filed on Apr. 28, 2000.

This application is related to the following commonly-owned co-pending patent application Ser. No. 09/680,339, filed on Oct. 5, 2000: METHOD FOR UNIQUE DETERMINATION OF FET EQUIVALENT CIRCUIT MODEL PARAMETERS, by Roger Tsai. This application is also related to the following commonly-owned co-pending patent applications all filed on Apr. 28, 2000, S-PARAMETER MICROSCOPY FOR SEMICONDUCTOR DEVICES, by Roger Tsai, Ser. No. 60/200,307, EMBEDDING PARASITIC MODEL FOR PI-FET LAYOUTS, by Roger Tsai, Ser. No. 60/200,810, SEMI-PHYSICAL MODELING OF HEMT DC-TO-HIGH FREQUENCY ELECTROTHERMAL CHARACTERISTICS, by Roger Tsai, Ser. No. 60/200,648, SEMI-PHYSICAL MODELING OF HEMT HIGH FREQUENCY NOISE EQUIVALENT CIRCUIT MODELS, by Roger Tsai, Ser. No. 60/200,290, HYBRID SEMI-PHYSICAL AND DATA FITTING HEMT MODELING APPROACH FOR LARGE SIGNAL AND NON-LINEAR MICROWAVE/MILLIMETER WAVE CIRCUIT CAD, by Roger Tsai and Yaochung Chen, Ser. No. 60/200,622, and $PM^2$: PROCESS PERTURBATION TO MEASURE MODEL METHOD FOR SEMICONDUCTOR DEVICE TECHNOLOGY MODELING, by Roger Tsai, Ser. No. 60/200,302.

BACKGROUND OF THE INVENTION

1. Field of the Invention

The present invention relates to a method for modeling semiconductor devices and more particularly to a method for modeling semiconductor devices, such as field effect transistors (FET) and high electron mobility transistors (HEMT) for relatively accurately determining the physical device characteristics and small-signal characteristics to enable the high frequency performance of the device to be forecasted.

2. Description of the Prior Art

HEMT technology provides unparalleled, high-performance characteristics at high frequencies (microwave to millimeter wave). As such, HEMTs are used in various RF applications. In order to accurately forecast the performance of such devices it is necessary accurately model the effect of the components physical structure on its high frequency small signal characteristic. Thus, it is necessary to know how physical changes to the device will effect device performance in order to determine what process changes may be acceptable to improve RF yield product and which may be unacceptable which decrease yield.

Physical changes in such devices are known to occur as a result of various uncontrolled process events, manufacturing equipment changes or intentional process enhancement. Currently two methods for modeling the small signal characteristics of HEMT devices are known: equivalent circuit modeling; and physical device simulation.

Equivalent circuit modeling utilizes networks of linear electrical elements to model the small signal performance of the device. In the case of HEMT devices, a typical equivalent circuit topology is shown in FIG. 1. This equivalent circuit model is known to accurately model measured S-parameters (small signal characteristics) of HEMT devices up to 120 GHz.

Unfortunately, there is little correlation between the topology of the equivalent circuit and the physical structure of the device. The rough correlation of each equivalent circuit element to a location and function within a typical HEMT structure is shown in FIG. 2. As such, the small signal models are known to perform well at modeling measured S-parameters but usually contain model elements that drastically diverge from known physical quantities and characteristics. These misrepresentations of the physical device are know to manifest as violations of basic semiconductor device principles. For example, basic device laws dictate that small signal model parameters "scale" in a predictable manner as the periphery is changed. However, most models produced by conventional means become less and less accurate as scaling is applied. As discussed above, small signal characteristics can also be simulated directly from physical device simulators. Such physical device simulators utilize comprehensive data about material characteristics and the basic device physics to simulate the actual physical location and structure of HEMT devices. Such simulators are known to be based upon finite element and Monte Carlo approaches. Such analytical tools are adapted to accept input in the form of the device physical structure, as generally shown in FIGS. 3, 4 and 5. In particular, these figures show the typical cross section and the "epi" stack used for physical simulation of specific device structures. In particular, FIG. 3 illustrates a rough scale drawing of a cross section of an exemplary HEMT device. FIG. 4 illustrates how the cross section of information regarding device structure is input into a known physical device simulator tool, such as APDS 1.0 by Agilent. FIG. 5 illustrates how the epi stack information is input into the physical device simulator. FIG. 6 illustrates where the epi stack physically resides within the total device structure.

Since these tools use a physical structure to simulate performance, the correspondence between simulated small signal performance and the device's physical characteristics are relatively strong. However the ability of the device simulators to accurately model real measured small signal characteristics is relatively inaccurate. An example of such results is shown below in Table 1 which provides a comparison of the extracted equivalent circuit model elements using equivalent circuit modeling of measured S-parameter data and the results as modeled using a physical device simulator, for example, using APDS 1.0.

TABLE 1

Comparison of Modeled Equivalent Circuit Results from Prior Art Methods

| Intrinsic Equivalent Circuit Parameter | Equivalent Circuit Model | Physical Device Simulator |
|---|---|---|
| Cgs | 0.227745 pF | 0.1619 pF |
| Rgs | 64242 Ω | infinite Ω |
| Cgd | 0.017019 pF | 0.01019 pF |
| Rgd | 133450 Ω | infinite Ω |
| Cds | 0.047544 pF | 0.044823 pF |
| Rds | 160.1791 Ω | 736 Ω |
| Gm | 135.7568 mS | 66 mS |
| Ri | 3.034 Ω | 2.304 Ω |
| Tau | 0.443867 pS | 1.433 pS |

As such, there is a need for a relatively accurate method for relating known physical characteristics of a HEMT device to its measured small signal characteristics. Specifically accurate methods are needed for producing small signal models that are consistent for: measured to model accuracy; physical properties; periphery scaling and bias dependence.

SUMMARY OF THE INVENTION

Briefly the present invention relates to a semi-physical device model that can represent known physical device characteristics and measured small signal characteristics relatively accurately. The semi-physical device model in accordance with the present invention uses analytical expressions to model the fundamental electric charge and field structure of a HEMT internal structure. These expressions are based on the device physics but are in empirical form. In this way, the model is able to maintain physical dependency with good fidelity while retaining accurate measured-to-modeled small signal characteristics. The model in accordance with the present invention provides model elements for a standard small signal equivalent circuit model of FET. The model elements are derived from small signal excitation analysis of intrinsic charge and electric field as modeled within the device by the semi-physical HEMT model. As such, the RF performance can be predicted at arbitrary bias points.

DESCRIPTION OF THE DRAWINGS

These and other advantages of the present invention will be readily understood with reference to the following specification and attached drawings wherein:

FIG. 21A and 21B are graphical illustrations of the extracted parameters from measured device I-V's for process control monitor testing.

FIG. 22 is a graphical illustration of the measured vs semi-physically simulated process variation for Gmpk and Vgspk.

DETAILED DESCRIPTION

The present invention relates to a semi-physical device model which can be used to simulate RF performance through physically-based device models. The semi-physical model is an analytical model based upon empirical expressions that model the physics of HEMT operation, hence the terminology "semi-physical". The model incorporates real process parameters, such as gate length recess, etch depth, recess undercut dimensions, passivation nitride thickness, and the like. By using empirical expressions, the semi-physical model is able to maintain relatively good measured to modeled accuracy while accounting for the effects of process variations on the device performance.

Figure 1:
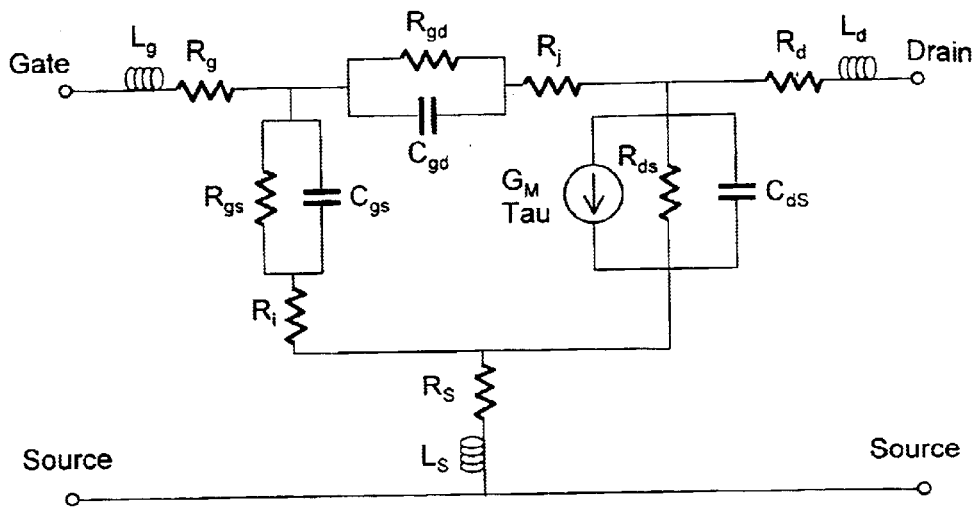
FIG. 1 is schematic diagram of an exemplary small signal equivalent circuit model for a HEMT device.
Figure 2:
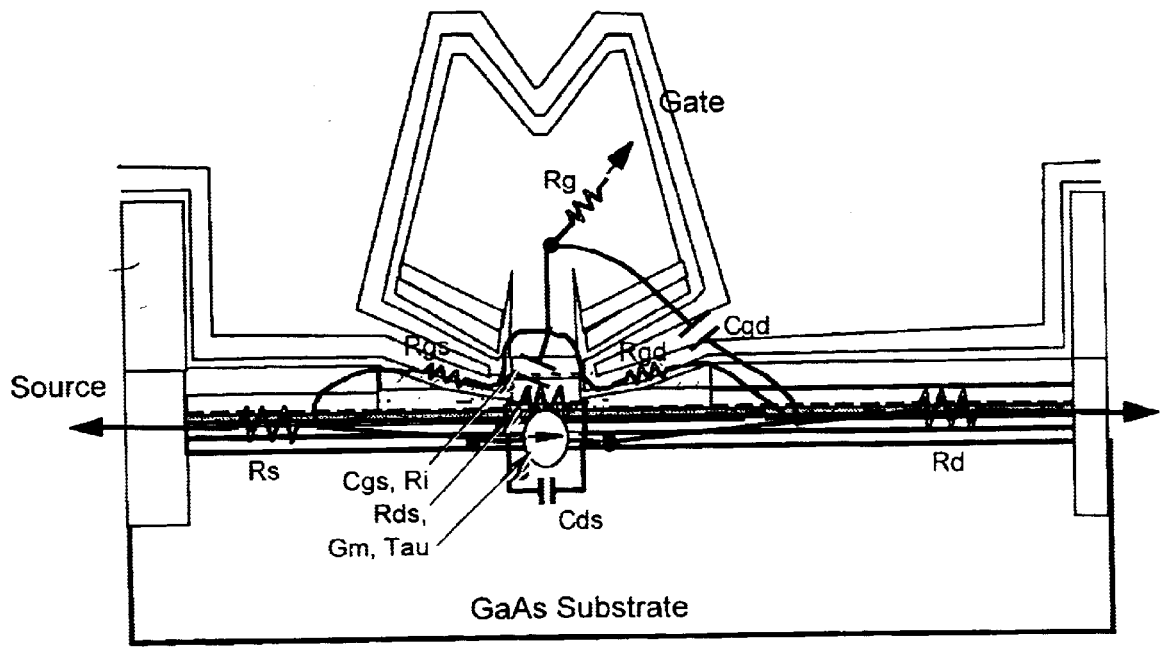
FIG. 2 is a sectional view of an exemplary HEMT illustrating the rough translation of the physical origins for each of the equivalent circuit elements illustrated in the small signal circuit model in FIG. 1.
Figure 3:
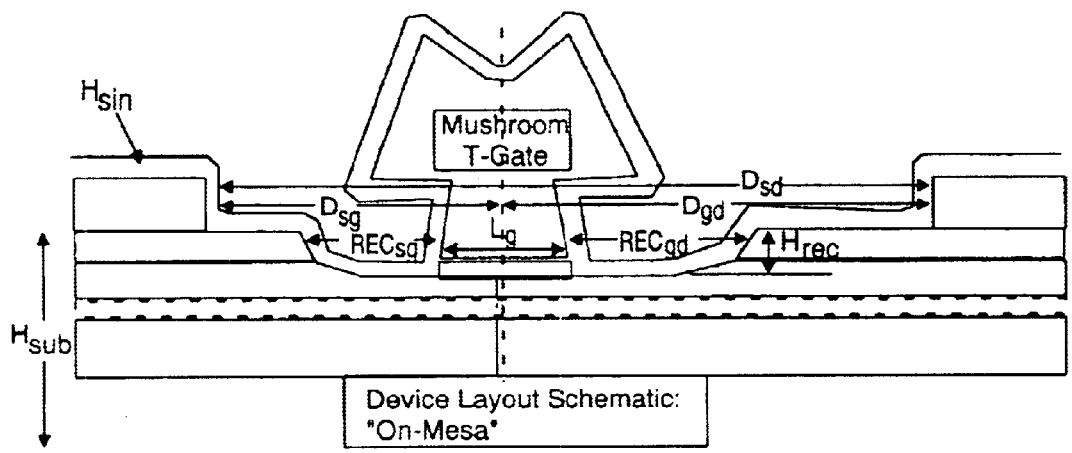
FIG. 3 is a cross-sectional view of a HEMT illustrating the regions in the HEMT which correspond to the various circuit elements in the small signal equivalent circuit model illustrated in FIG. 1.
Figure 4:
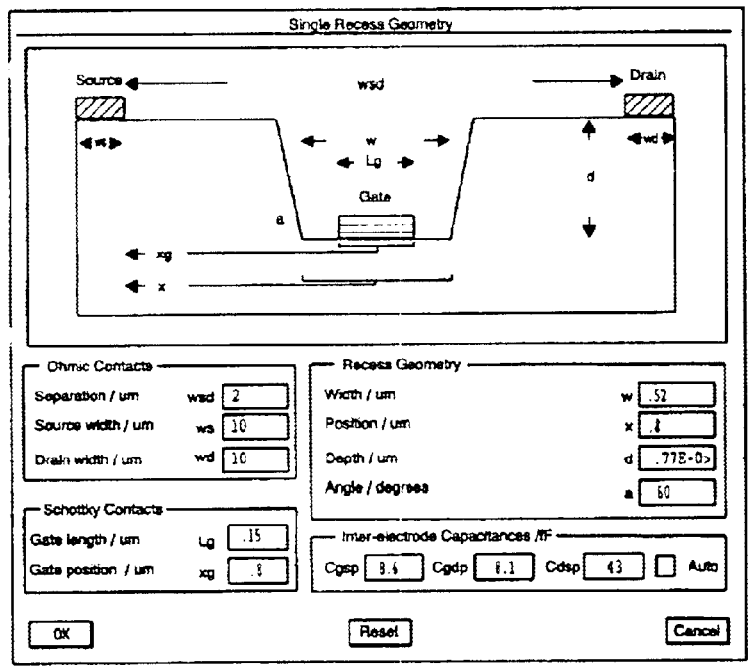
FIG. 4 is an example of a cross-sectional descriptive input of a physical HEMT device structure by a conventional physical device simulation tool.
Figure 5:
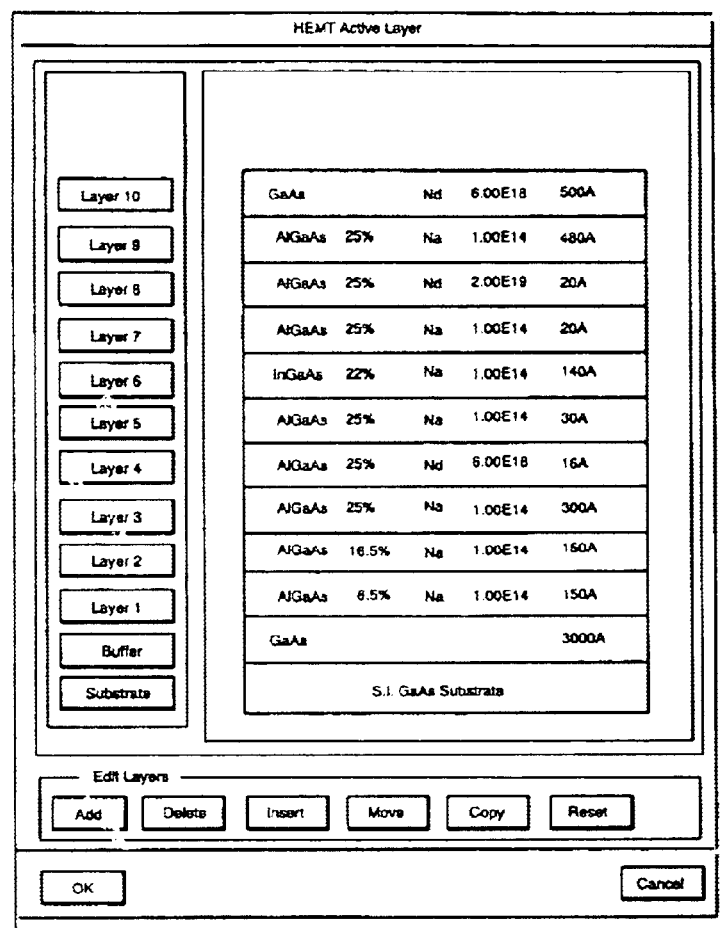
FIG. 5 is an example of an epi stack descriptive input of a physical HEMT device structure for a known physical device simulation tool.
Figure 6:
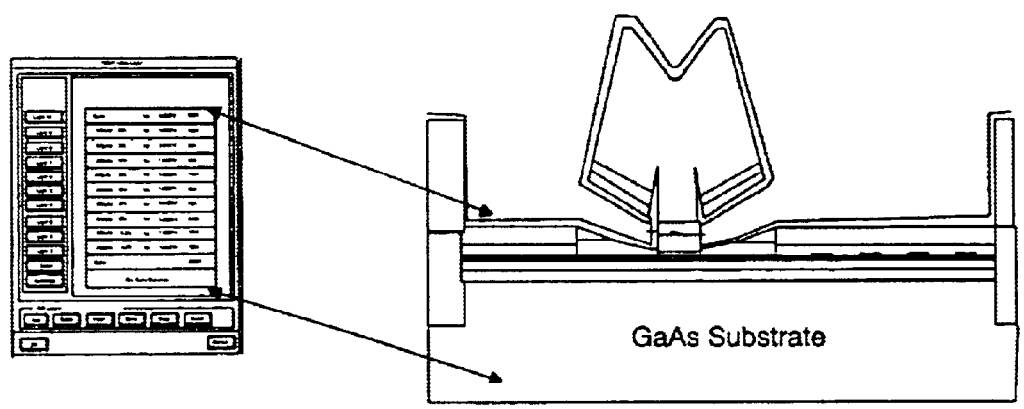
FIG. 6 is an example illustrating the location of the epi stack within the device structures cross-sectional view.

The semi-physical model in accordance with the present invention provides model elements for the standard small signal equivalent circuit model or FET as illustrated in FIG. 1. However, unlike conventional methods, the model elements are derived from small signal excitation analysis of the intrinsic charge and electric fields within the device. As such, the simulated small signal model elements represent a relatively accurate physical equivalent circuit description of a physical FET.

The general methodology for the semi-physical modeling of intrinsic charge, electric conductance and electrical field is as set forth below. First, the relationships between the conduction band offsets and electrical permitivities and material composition for the various materials in the epi stack are determined. These relationships can be performed analytically or by fitting simulated data from physical simulators. Subsequently, the basic electron transport characteristics in any of the applicable bulk materials in the epi stack are determined. Once the electron transport characteristics are determined, the undepleted linear channel mobility is determined either through material characterization or physical simulation. Subsequently, the Schottky barrier height value or expressions are determined. Once the Schottky barrier height value is determined, the semi-physical equations are constructed modeling the following characteristics:

Fundamental-charge control physics for sheet charge in the active channel as controlled by the gate terminal voltage.

Average centroid position of the sheet charge within the active channel width.

Position of charge partitioning boundaries as a function of gate, drain and source terminal voltages.

Bias dependence of linear channel mobility and surface depleted regions.

Bias dependence of the velocity saturating electric field in the channel.

Saturated electron velocity.

Electrical conductance within the linear region of the channel, under the gate.

Electrical conductance within the source and drain access regions.

Once the semi-physical equations are determined, the empirical terms of the semi-physical modeling equations are adjusted to fit the model I-V (current voltage) characteristics against measured values. Subsequently, the empirical terms are interactively readjusted to achieve a simultaneous fit of measured C-V (capacitance-voltage) and I-V characteristics. Lastly, the empirical modeling terms are fixed for future use.

Figure 7:
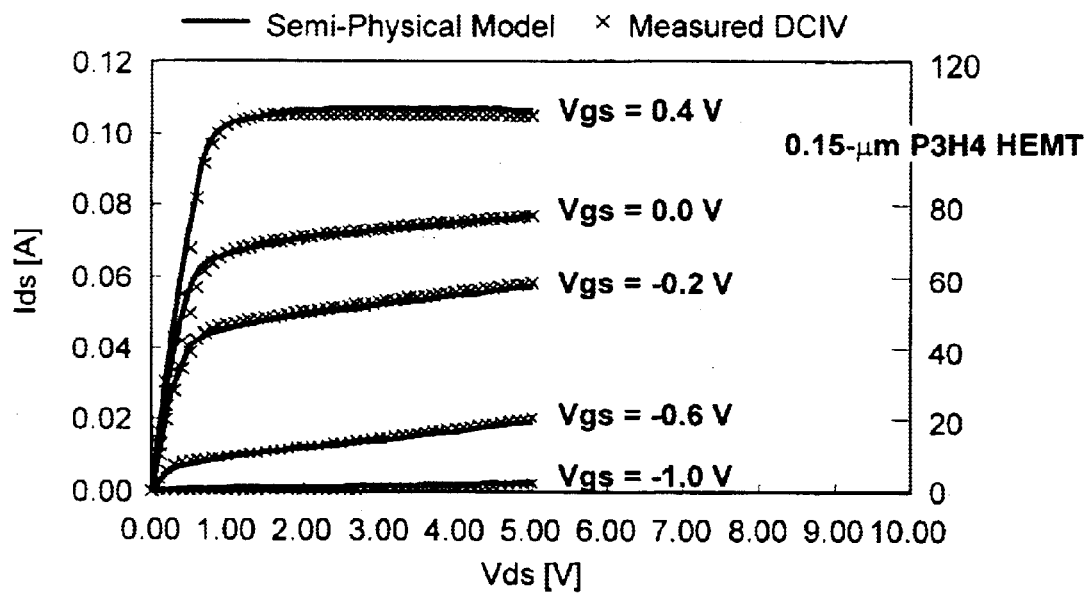
FIG. 7 is an example of a relatively accurate measured-to-model I-V characteristics using the semi-physical modeling method in accordance with the present invention.

By constructing a comprehensive set of semi-physical equations that cover all of the physical phenomenon as mentioned above, the physical operating mechanisms within a HEMT device can be relatively accurately determined. FIG. 7 illustrates a set of relatively accurate measured-to-modeled I-V characteristics for a HEMT using the semi-physical modeling discussed herein. In particular, FIG. 7 illustrates the drain-to-source current $I_{ds}$ as a function of the drain-to-source voltage $V_{ds}$ for various gate biases, for example, from 0.4V to −1.0V. As shown in FIG. 7, solid lines are used to represent the semi-physical model while the Xs are used to represent measured values. As shown in FIG. 7, a close relationship exists between the measured values and the modeled parameters.

Figure 8:
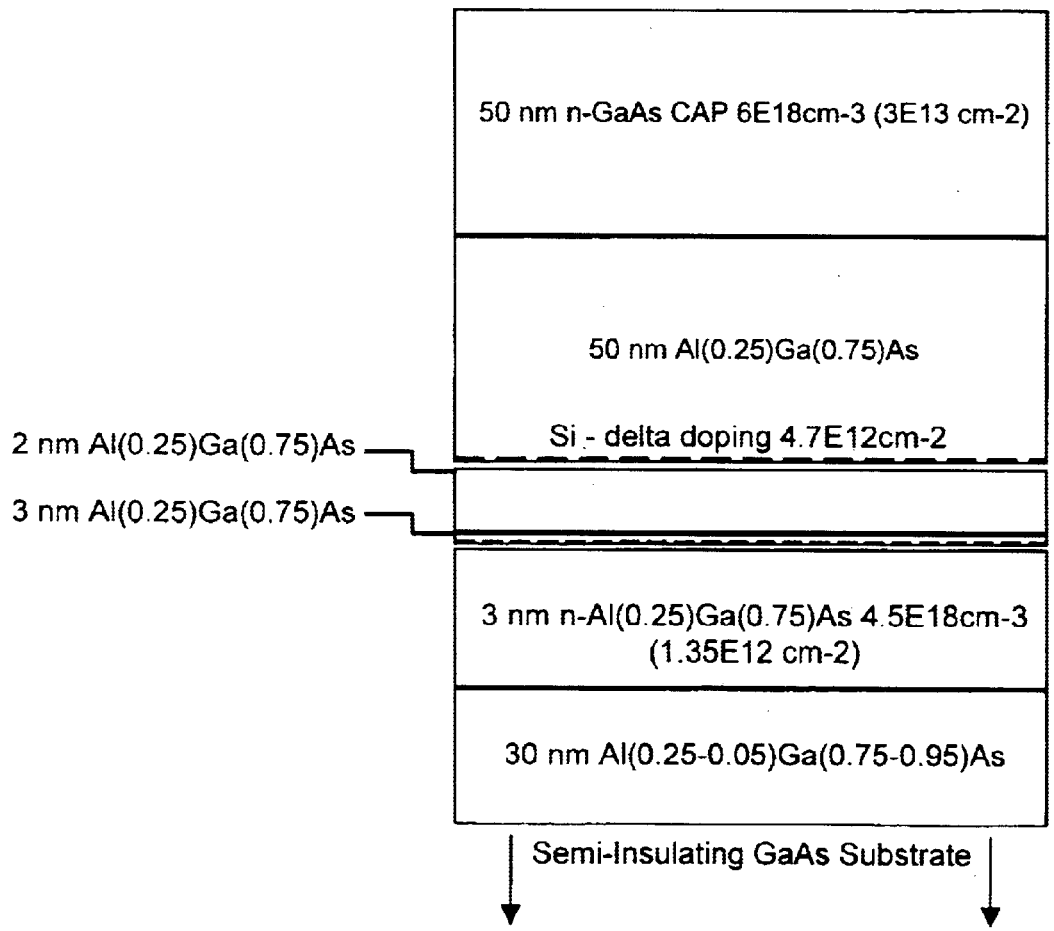
FIG. 8 is a elevational view illustrating an epi stack for an exemplary HEMT.
Figure 9:
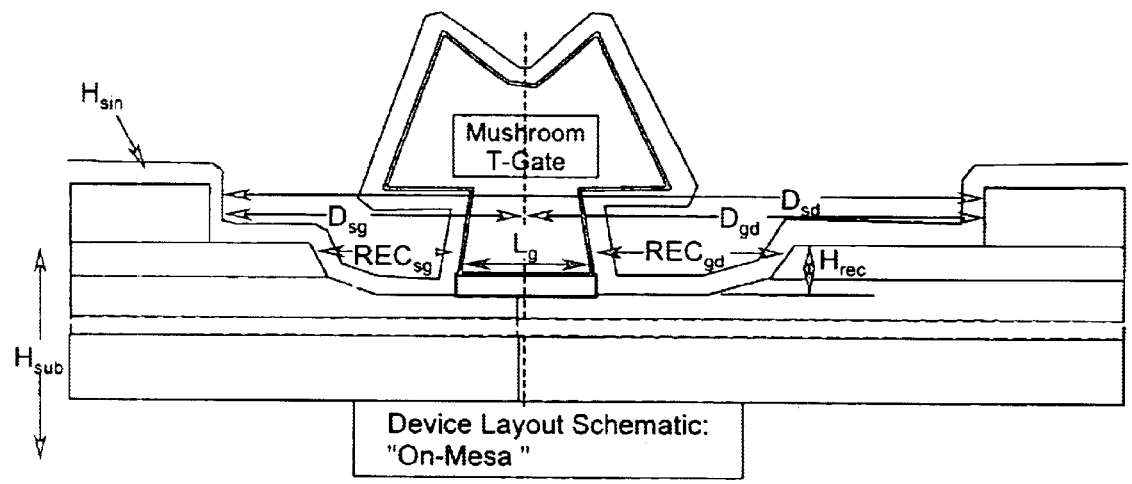
FIG. 9 is a cross-sectional view of a HEMT for the exemplary epi stack illustrated in FIG. 8.
Figure 10:
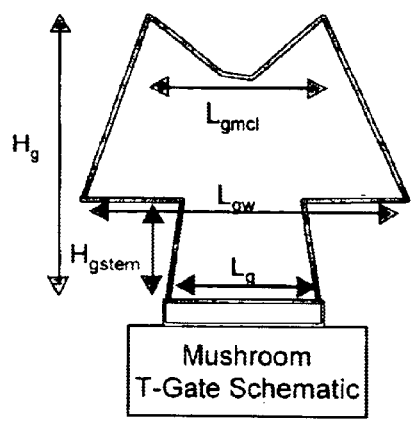
FIG. 10 is a blown up diagram of the cross-sectional parameters pertaining to the T-gate geometry for the exemplary epi stack illustrated in FIG. 8.

An example of semi-physical modeling for physical device operation in accordance with the present invention is provided below. The example utilizes an exemplary device as illustrated in FIGS. 8 and 9. Table 2 represents exemplary values for the physical cross-section dimension parameters in the model. FIG. 10 relates to a blown up T-gate characteristic which is correlated to the parameters identified in Table 2.

TABLE 2

Values for the Physical Dimension Parameters Input into Device Cross Section

| Layout Parameter | | Units | Value |
|---|---|---|---|
| Gate Length | Lg | [μm] | 0.150 |
| Wing Length | Lgw | [μm] | 0.520 |
| Gate Mushroom Crown Length | Lgmcl | [μm] | 0.200 |
| Total Gate Height | Hg | [μm] | 0.650 |
| Gate Stem Height | Hgstem | [μm] | 0.300 |
| Gate Sag Height | Hgsag | [μm] | 0.100 |
| Gate Cross-Sectional Area | GateArea | [μm²] | 0.187 |
| Max Cross-Sectional Area | MaxArea | [μm²] | 0.364 |
| Total Gate Penph | Wg | [μm] | 200.000 |
| # Fingers | N | [ ] | 4.000 |
| Source-Drain Spacing | Dsd | [μm] | 1.800 |
| Gate-Source Spacing | Dsg | [μm] | 0.700 |
| Gate-Drain Spacing | Dgd | [μm] | 1.100 |
| Gate-Source Recess | RECsg | [μm] | 0.160 |
| Gate-Drain Recess | RECgd | [μm] | 0.240 |
| Recess Etch Depth | Hrec | [A] | 780.000 |
| SiN Thickness | Hsin | [A] | 750.000 |
| Gatefeed-Mesa Spacing | Dgfm | [μm] | 2.000 |
| Gateend-Mesa Overlap | Dgem | [μm] | 2.000 |
| Finger-Finger Spacing Thru Drain | Dffd | [μm] | 16.500 |
| Finger-Finger Spacing Thru Source | Dffs | [μm] | 13.500 |
| Source Airbridge Inset? | AB? | [ ] | P |
| Source Airbridge Inset | Dsabin | [μm] | 28.000 |
| Source Airbridge Height | Hsab | [μm] | 3.500 |
| Source-Gate Airbridge Clearance | Hgsab | [μm] | 1.640 |
| Source Pad Width | Ws | [μm] | 12.000 |
| Drain Pad Width | Wd | [μm] | 14.000 |
| Substrate Thickness | Hsub | [μm] | 100.000 |

As mentioned above, the semi-physical modeling of the intrinsic charge and electric field within the HEMT device is initiated by determining the relationships between the conduction band offset, electrical permitivities and material composition for the various materials in the epi stack. Material composition related band offset and electrical permitivity relationships may be obtained from various references, such as "Physics of Semiconductor Devices", by Michael Shur, Prentice Hall, Englewood Cliffs, N.J. 1990. The basic electron transport characteristics, for example, for the linear mobility of electron carriers in the bulk GaAs cap layer may be determined to be 1350 cm²/Vs, available from "Physics of Semiconductor Devices", supra. The linear mobility of electron carriers in the undepleted channels is assumed to be 5500 cm²/Vs. This value may be measured by Hall effect samples which have epi stacks grown identically to the stack in the example, except for some differences in the GaAs cap layer. The Schottky barrier height is assumed to be 1.051 volts, which is typical of platinum metal on a AlGaAs material.

The following equations represent the semi-physical analytical expressions to model the charge control and centroid position in the sample.

| Description | Symbol | Units | Expression |
|---|---|---|---|
| Empirical Charge Control Expression | $N_s$ | [cm$^{-2}$] | $= N_s' / [1 + (N_s'/N_{max})^\gamma]^{1/\gamma}$ |
| Ideal Charge Control with Filling Law | $N_s'$ | [cm$^{-2}$] | $= 2 N_o \ln[1 + \exp(V_{gt}/(\eta V_{th}))]$ |
| Ideal Charge Control | $N_o$ | [cm$^{-2}$] | $= \epsilon_i \eta V_{th}/[2 q (d_i + \Delta d_i) 10000]$ |
| Maximum Channel Charge | $N_{max}$ | [cm$^{-2}$] | $= (N_{max0} + N_{maxL} V_{ds}^{n_{Nmax}}) H_{chan}/H_{chanREF})$ |
| Initial Gate-Channel Voltage | $V_{gt}$ | [V] | $= [V_{gs} - \Phi_b - \Delta E_c - V_{TO} - \sigma V_{ds}]$ |
| Threshold Voltage | $V_{TO}$ | [V] | $= \Phi_b - \Delta E_c - V_T$ |
| Doping Threshold Voltage | $V_T$ | [V] | $= q N_{sdelta} d_\delta 10000/\epsilon_i$ |
| Gate-to-Channel Spacing | $d_i$ | [m] | $= \{(H_{space} + H_{bar} + H_{fdope} + H_{cap}) - H_{rec}\}/(10^{10})$ |
| | | | note that the expression for di can be changed for different epi-stacks |
| Movement of Sheet Carrier Centroid | $\Delta d_i$ | [m] | $= H_{chan}[1 = d_{IK}*V_{gte}/H_{chanREF} - d_{iL} \cdot V_{ds}/H_{chanREF}]$ |
| Empirical Charge Control Shaping Parameter | $\gamma$ | [] | |
| Semi-Physical Subthreshold Populating Rate | $\eta$ | [] | |
| Dielectric Permitivity of the Barrier Layer | $\epsilon_i$ | [F/m] | |
| The thermal voltage | $V_{th}$ | [V] | $= K_B T_{amb}/q$ |
| Ambient Temperature | $T_{amb}$ | [K] | |
| Fixed Emprical Maximum Sheet Charge | $N_{max0}$ | [cm$^{-2}$] | |
| Vds Dependent Emprical Maximum Sheet Charge | $N_{maxL}$ | [cm$^{-2}$] | |
| Vds Dependent Emprical Nmax shaping term | $n_{Nmax}$ | [] | |
| Channel Layer Thickness | $H_{chan}$ | [A] | |
| Reference Channel Layer Thickness | $H_{chanREF}$ | [A] | (Channel Thickness for the sample for which the model was first derived) |
| Schottky Barrier Height | $\Phi_B$ | [V] | |
| Conduction Band Offset between Channel and Barrier | $\Delta E_C$ | [V] | |
| Front Delta Doping | $N_{Sdelta}$ | [cm$^{-2}$] | note that this expression can be modified for non-delta doped epi-stacks |
| Gate-to-Front Delta Doping Spacing | $d\delta$ | [m] | $= \{(H_{bar} + H_{fdope} + H_{cap}) - H_{rec}\}/(10^{10})$ |
| Barrier Thickness between front doping and channel | $H_{space}$ | [A] | |
| Barrier Layer Thickness before front doping layer | $H_{bar}$ | [A] | |
| Front Doping layer thickness | $H_{fdope}$ | [A] | |
| Cap layer thickness | $H_{cap}$ | [A] | |
| Empirical Drain-Induced Barrier-Lowering Term | $\sigma$ | [] | |
| Sheet Charge Position Gate Bias Factor | $d_{IK}$ | [A/V] | |
| Sheet Charge Position Drain Bias Factor | $d_{IL}$ | [A/V] | |
| Effective Gate Voltage | $V_{gte}$ | [V] | $= V_{th}[1 + V_{gt}/2V_{th} + \text{sqrt}(\delta^2 + (V_{gt}/2V_{th} - 1)^2]$ |
| Empirical Transition Width Parameter | $\delta$ | [] | |

As used herein, Ns represents the model sheet carrier concentration within the active channel. Ns' represents the ideal charge control law and is modeled as a semi-physical representative of the actual density of state filling rate for energy states within the channel v. gate voltage. The gate-to-channel voltage used for the charge control, Vgt, is a function of the Schottky barrier height, conduction band offsets and doping in the epi stack as is known in the art. The following equations represent the semi-physical expression used to model the position of regional charge boundaries within the HEMT device. These expressions govern how to partition the model charge between the influence of different terminals.

| Description | Symbol | Units | Expression |
|---|---|---|---|
| Effective Gate Length | $L_{geff}$ | [$\mu$m] | $= L_g + \Delta L_s + \Delta L_d$ |
| Gate-Source Control Region | $L_{gs}$ | [$\mu$m] | $= L_g/2 + \Delta L_s + X_{D1}$ |
| Source-Side Effective Gate Length Extension | $\Delta L_x$ | [$\mu$m] | $= \Delta L_{s0} + \Delta L_K * V_{gte}$ |
| Drain-Side Effective Gate Length Extension | $\Delta L_d$ | [$\mu$m] | $= \Delta L_{d0} + \Delta L_K * V_{gte} + \Delta L_L * V_{dse2}$ |
| Gate-Drain Control Region | $L_{gd}$ | [$\mu$m] | $= (L_g/2 + \Delta L_d) * \{\tanh[10(L_g/2 - X_{D1})] + 1\}/2$ |
| Bias Dependent Extension of the Saturated Transport Region | $X_{D1}$ | [$\mu$m] | $= X_{DL} V_{ds} M_{XdL}/\{M_{XdK} V_{gfe} *(1 + [X_{DL}V_{ds}M_{Xdl}/(M_{XdK}V_{gte}(L_g/2 + REC_{gd}))]^m\}^{1/m}$ |
| Empirical Drain-Saturated Transport Boundary Factor | $X_{DL}$ | [$\mu$m] | $= L_g V_{ds}/\{2[1 + (V_{ds}/V_{satn})^m]^{(1/m)}\}$ |
| Position of the Boundary between Regions 1 and 2 | $X_S$ | [$\mu$m] | $= X_{s0}\{M_{Xs}[1/(1 + (V_{ds}/V_{satn})^m]^{(1/m)} - V_{ds}m(V_{ds}/V_{satn})^{(m-1)}/\{V_{satn}m[1 + (V_{ds}/V_{satn})^m]^{(1/m+1)}\}] - V_{ds}M_{XSL} + V_{gte}M_{XSK}\}$ |
| Note: Region 1 denotes the inner region, while Region 2 denotes the saturated region of the channel | | | |
| Empirical Effective Gate Length Extension Gate Bias Factor | $\Delta L_K$ | [$\mu$m/V] | |
| Empirical Effective Gate Length Extension Drain Bias Factor | $\Delta L_L$ | [$\mu$m/V] | |
| Effective Drain-Source Voltage Control-2 | $V_{dse2}$ | [V] | $= V_{ds}/0 [1 + (V_{ds}/V_{satn})^m]^{1/m}$ |
| Rough, Intrinsic Saturation Voltage | $V_{satn}$ | [V] | $= I_{sat}/g_{chi}$ |
| Rough, Intrinsic Saturation Current Level | $I_{sat}$ | [A] | $= g_{chi}V_{gte}/[1 + g_{chi}R_s + \text{sprt}(1 + 2g_{chi}R_s + (V_{gte}/V_L)^2)]$ |

-continued

| | | | |
|---|---|---|---|
| Intrinsic Conductance of the Linear Region, Under the gate | $g_{chi}$ | [S] | $= (q\ N_3\ \mu_{ave}Wg)/Lg$ |
| Rough Intrinsic Saturation Voltage Level | $V_L$ | [V] | $= F_s * L_g$ |
| Empirical Knee Shaping Parameter | m | [] | |
| Empirical Region 2 extension Drain Bias Factor | $M_{XdL}$ | [] | |
| Empirical Region 2 extension Gate Bias Factor | $M_{XdK}$ | [] | |
| Fine Intrinsic Saturation Voltage | $V_{saten}$ | [V] | $= I_{satoom}/g_{chi}$ |
| Fine Intrinsic Saturation Current Level | $I_{satcom}$ | [A] | $= g_{chi}V_{gte}V_L * [-V_L(A + g_{chi}R_s) +$ $\text{sqrt}(V_L^2(A + g_{chi}R_s)^2 + V_{gte}^2 - (g_{chi}R_sV_L)^2)]/$ $[V_{gte}^2(1 - g_{chi}R_s(V_L/V_{gte})^2)]$ |
| Saturation Region Length Ratio | A | [] | $= X_s/L_{geff}$ |
| Initial Starting position for Region 1 & 2 Boundary | $X_{s0}$ | [μm] | $= Lg/2$ |
| Region 1 & 2 Boundary Bias Factor | $M_{Xs}$ | [] | |
| Region 1 & 2 Boundary Drain Bias Factor | $M_{XsL}$ | [] | |
| Region 1 & 2 Boundary Drain Bias Factor | $M_{XsK}$ | [] | |

The following equations represent the semi-physical expressions used to model the bias dependence of linear channel mobility in depleted regions.

| | | | |
|---|---|---|---|
| Depleted Channel Mobility | $\mu$ave | [cm²/V*s] | $= \mu_{dchan} + \mu_{dK} \cdot V_{gte}$ |
| Fixed Depleted Channel Mobility | $\mu$dchan | [cm²/V*s] | |
| Depleted Channel Mobility Gate Bias Factor | $\mu$dK | [cm²/V²*s] | |

The following equations are the semi-physical expressions used to model the bias dependence of the saturating electric field and saturation velocity.

| | | | |
|---|---|---|---|
| Saturating Electric Field | $F_S$ | [V/μm] | $= v_s/$ $[(\mu_{sat} + \mu_{satK}V_{gte})10000]$ |
| Fixed Saturating Channel Mobility | $\mu$sat | [cm²/V*s] | |
| Saturating Channel Mobility Gate Bias Factor | $\mu$satK | [cm²/V²*s] | |
| Saturation Velocity | $V_s$ | [cm/s] | |

Figure 11:
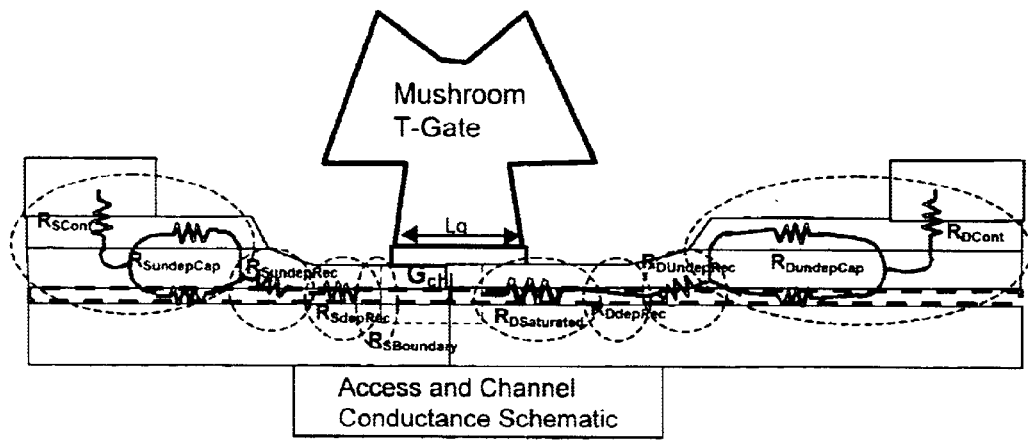
FIG. 11 is a diagram of an electric conductance model used in the semi-physical example.

FIG. 11 is a schematically illustrates how electrical conductance in the source and drain access regions are modeled in the example.

The following equations describe the semi-physical expressions for the source access region conductance:

| | | | |
|---|---|---|---|
| Source Accesa Resistance | $R_S$ | [Ω] | $= (R_{SundepCap} + R_{SAccess} + R_{SBoundary})/W_g$ |
| Source Access Resistance: Channel and Cap | $R_{SundepCap}$ | [Ω*μm] | $= R_{cont}/RF_{rconF} +$ $R_{SH}[D_{sg} \cdot (REC_{sg} + L_g/2)]$ |
| Source Access Resistance. Recess and Undepleted Cap | $R_{SAccess}$ | [Ω*μm] | $= R_{SdepRec}^{ON} * MR_s * \tanh\{[KC_{fK} *$ $(V_{gs} = VC_{fOn} + V_{ds} *MC_{fL})]+ 1\}/2 * \{V_{gs}/$ $2*[1-\tanh(KR_{sK}(V_{gs} - VR_{sOn}))]\} * \{\tanh$ $[KR_{sSat}(V_{ds} - VR_{sKnee})] + 1\}/2 + R_{SundepRec} * \{\tanh$ $[KR_{sK}(V_{gs} - VR_{sOn})]+ 1\}/2$ |
| Source Access Resistance: Crowding resistance due to conductance mismatch | $R_{SBoundary}$ | [Ω·μm] | $= R_{SdepRec}^{ON} * MR_s * \tanh\{[KR_{sK}*V_{gs} + KR_{sL}*V_{ds} +$ $VR_{sOff}] + 1\}/2 * \{(1 + V_{ds}MR_{sL})*MR_{sK}*[1 -$ $\tanh(KR_{sSat}(V_{ds} \cdot VR_{sKnee}))]/ [2*(1 + [V_{gs}/((1 +$ $V_{ds}MR_{sL})*MR_{sK})]^{Rs})^{(1/\gamma Rs)}]\}$ |
| Resistance of the Source Recess Access region at high on-state bias ($V_{on}$) | $R_{SdepRec}^{ON}$ | [Ω*μm] | $= R_{SHdep}(REC_{sg})$ |
| Resistance of the Undepleted Source Recess Access region | $R_{SundepRec}$ | [Ω*μm] | $= R_{SHundep}(REC_{sg})$ |
| Uncapped, Fully Depleted Sheet Resistance | $R_{SHdep}$ | [Ω/sq] | $= 1/(q\ N_{max}\mu_{ave})$ |
| Capped, Undepleted Sheet Resistance | $R_{SH}$ | [Ω/sq] | $= 1/(1/R_{SHCap} + 1/R_{SHundep})$ |
| Uncapped, Undepleted Sheet Resistance | $R_{SHundep}$ | [Ω/sq] | $= F_{surfUndep}/(q\ N_{max}\mu_{undchan})$ |
| Cap Sheet Resistance | $R_{SHCap}$ | [Ω/sq] | $= 1/[q\ N_{sCap}\mu_{cap}(H_{cap} - H_{capEtch})]$ |
| Surface Depletion Factor | $F_{surfUndep}$ | [] | |
| High On-state bias: Diode Turn-on voltage | $V_{ON}$ | [V] | $= \Phi_b - \Delta E_c - \Delta E_f$ |
| Ohmic Contact Resistance | $R_{cont}$ | [Ω*μm] | |
| RF Ohmic Contact Resistance Reduction Factor | $RF_{rconF}$ | [] | |

-continued

| | | |
|---|---|---|
| Source Access Resistance Bias Modification Factor | $MR_s$ | [] |
| Cf-Vds Bias Modification Factor | $MC_{fL}$ | [] |
| Rs-Vds Bias Modification Factor | $MR_{sL}$ | [] |
| Rs-Vga Bias Modification Factor | $MR_{sK}$ | [] |
| Cf-Vga Swith point to On-state | $VC_{fOn}$ | [] |
| Cf-Vgs Bias Expansion Factor | $KC_{fK}$ | [] |
| Rs-Vga Swith point to On-state | $VR_{sOn}$ | [] |
| Rs-Vga Swith point to Off-state | $VR_{sOff}$ | [] |
| Rs-Vds Swith point from Off-On transition | $VR_{sKnee}$ | [] |
| Rs-Vds Bias Expansion Factor | $KR_{sL}$ | [] |
| Rs-Vgs Bias Expansion Factor | $KR_{sK}$ | [] |
| Rs-Vds Bias Expansion Factor @ Rs Saturation | $KR_{sSat}$ | [] |
| Rs Bias Shaping Factor | $\gamma R_s$ | [] |

15

The following equations describe the drain access region conductance:

| | | | |
|---|---|---|---|
| Drain Access Resistance | $R_D$ | [Ω] | $= (R_{DRF} + R_{DN})$ |
| Drain Access Resistance, except for recess access | $R_{DRF}$ | [Ω] | $= (R_{DAccess} + R_{Dundepcap} + R_{DundepRec} + R_{DSaturated})/W_g - R_{DN}$ |
| Drain Recess Access Resistance | $R_{DN}$ | [Ω] | $= (R_{DRec})/W_g$ |
| Drain Access Resistance: Recess snd Undepleted Cap | $R_{DAccess}$ | [Ω*μm] | $= R_{DdepRec}^{ON}(MR_d*V_{gs} + 1)[1 - \tanh[KR_{daccK}*[V_{gs} - VR_{dOn} + V_{ds}*MR_{daccL}]]]/2$ |
| Drain Access Resistance: Channel and Cap | $R_{DundepCap}$ | [Ω*μm] | $= R_{cont}/RF_{tonF} + R_{SH}[D_{gd} \cdot (REC_{gd} + L_g/2)]$ |
| Resistance of the Undepleted Drain Recess Access region | $R_{DundepRec}$ | [Ω*μm] | $= R_{SHundep}(REC_{gd})$ |
| Resistance of the Saturated Drain Recess Access region | $R_{DSaturated}$ | [Ω*μm] | $= MR_{dSat}*V_{ds}\exp\{-[V_{gs} + V_{ds}*MR_{dL} + VR_{dSatOff}]^2/(2 VR_{dSat\sigma})\}/\{VR_{dSat}[1 + (V_{ds}/VR_{dSat})^{\gamma Rd}]^{(\gamma RdA+1/\gamma Rd)}\}$ |
| Resistance of the Drain Recess Access region at high on-state bias ($V_{on}$) | $R_{DdepRec}^{ON}$ | [Ω*μm] | $= R_{SHdep}REC_{gd}$ |
| | $R_{DRec}$ | [Ω*μm] | $= \delta_{VL}\{1 + (R_{DAccess} - R_{DundepCap})/(2\delta_{VL}) + \text{sqrt}[\delta^2 + ((R_{DAccess} - R_{DundepCap})/(2\delta_{VL}) - 1)^2]\}$ |
| Drain Access Resistance Bias Modification Factor | $MR_d$ | [] | |
| Rd-Vds Access Bias Modification Factor | $MR_{accL}$ | [] | |
| Rd-Vgs Swith point to On-state | $VR_{dOn}$ | [] | |
| Rd-Vgs Swith point at saturation | $VR_{dSat}$ | [] | |
| Rdaccess-Vgs Bias Expansion Factor | $KR_{daccK}$ | [] | |
| Rd-Vds Saturation Bias Modification Factor | $MR_{dSat}$ | [] | |
| Rd-Vds Access Resistance Bias Modification Factor | $MR_{dL}$ | [] | |
| Rd-Vgs Saturation Swith point to Off-state | $VR_{dSatOff}$ | [] | |
| Rd-Vgs Saturation Swith point | $VR_{dSat}$ | [] | |
| Rd-Vgs Saturation Swith point transition width | $VR_{dSat\sigma}$ | [] | |
| Rd Bias Shaping Factor | $\gamma R_d$ | [] | |

Semi-Physical Determination of Small-Signal Equivalent Circuits

To derive values for the familiar small signal equivalent circuit as shown in FIG. 1, a small signal excitation analysis must be applied to the semi-physically modeled physical expressions. The method of applying such an analysis is as follows:

1) Gate Terminal Voltage Excitation

Apply a small+/− voltage delta around the desired bias condition, across the gate-source terminals.

Equivalent circuit element Gm=delta(Ids)/delta (Vgs') where delta (Vgs') is mostly the applied voltage deltas, but also subtracting out that voltage which is dropped across the gate source access region, shown as RsCont, RsundepCap, RsundepRec, ResdepRec, and RsBoundary in FIG. 11, above.

Equivalent circuit element Cgs and Cgd takes the form of delta(Nsn)/delta(Vgs)*Lgn, where delta (Nsn) is the appropriate charge control expression, and Lgn is the gate source or gate drain charge partitioning boundary length.

Equivalent circuit element Ri=Lgs/(Cgschannel*vs) where Cgs channel is the portion of gate source capacitance attributed to the channel only, and vs is the saturated electron velocity.

2) Drain Terminal Voltage Excitation

Apply a small +/− voltage delta around te same bias condition as in 1, but the delta is applied across drain source terminals.

Equivalent circuit element Rds=1/{delta(Ids)/delta(Vds')} where Vds' is mostly the applied voltage deltas, but also subtracting out voltage which is dropped over both the gate source and gate drain access regions.

Equivalent circuit element Cds is taken to be the sum of the appropriate fringing capacitance Semi-Physical models, or can take the form of delta(Nsd)/delta(Vds')*Xsat, were Nsd is the charge control expression for charge accumulation between the appropriate source and drain charge boundaries, and Xsat is the length of the saturated region, if in saturation.

3) On-mesa Parasitic Elements: The equivalent circuit elements, Rs and Rd are expressed by the appropriate electrical conduction models of the source and drain access regions.

The RF performance can be predicted at an arbitrary bias point.

Table 4 represents a comparison of the values for a high frequency equivalent circuit model derived from equivalent circuit model extraction from and semi-physical modeling for the sample illustrated in Table 2.

TABLE 3

Comparison of Modeled Equivalent Circuit Results for Semi-physical Modeling Method, and Equivalent Circuit Model Extraction

| Intrinsic Equivalent Circuit Parameter | Equivalent Circuit Model | Semi-Physical Device Model |
|---|---|---|
| Cgs | 0.227745 pF | 0.182 pF |
| Rgs | 64242 Ω | infinite Ω |
| Cgd | 0.017019 pF | 0.020 pF |
| Rgd | 133450 Ω | infinite Ω |
| Cds | 0.047544 pF | 0.033 pF |
| Rds | 160.1791 Ω | 178.1 Ω |
| Gm | 135.7568 mS | 124 mS |
| Ri | 3.034 Ω | 2.553 Ω |
| Tau | 0.443867 pS | 0.33 pS |

The results of the semi-physical modeling method produce a small-signal equivalent circuit values which are relatively more accurate than the physical device simulator in this case. Furthermore, given the differences in the parasitic embedding, treatment of the two approaches, the results given in Table 3 yield much closer results than a comparison of equivalent circuit values.

Table 4 lists the values of parasitic elements used in the model derivations. An important difference between the extracted equivalent circuit model and the semi-physically derived one is the use of Cpg and Cpd to model the effect of launch capacitance for the tested structure. This difference leads to the results of the extracted model results being slightly off from the optimum physically significant solution.

TABLE 4

Comparison of Modeled "Parasitic" Equivalent Circuit Results for Semi-physical Modeling Method, and Equivalent Circuit Model Extraction

| Extrinsic Equivalent Circuit Parameter | Equivalent Circuit Model | Semi-Physical Device Model |
|---|---|---|
| Rg | 1.678 Ω | 1.7 Ω |
| Lg | 0.029314 nH | 0.03 nH |
| Rs | 1.7 Ω | 1.21 Ω |
| Ls | 0.002104 nH | 0.003 nH |
| Rd | 3.309899 Ω | 5.07 Ω |
| Ld | 0.031671 nH | 0.02 nH |
| Cpg | 0 pF | 0.02 pF |
| Cpd | 0 pF | 0.01 pF |

Figure 12:
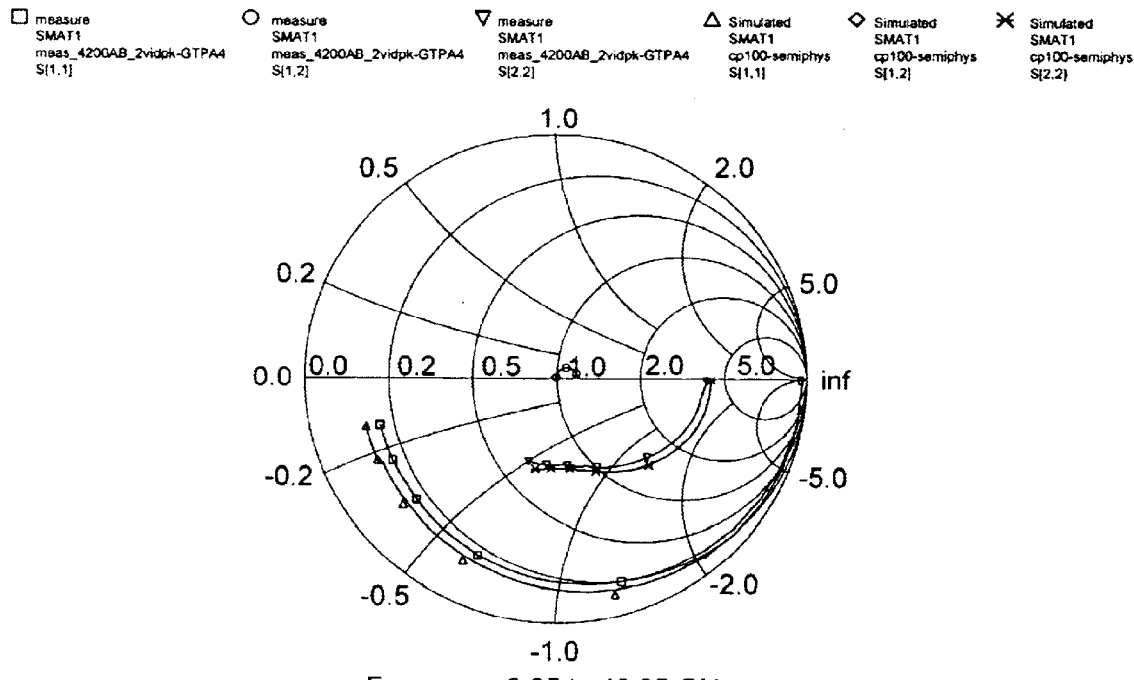
FIG. 12 is a Smith chart illustrating the measured vs modeled S-parameters S11, S12 and S22 simulated in accordance with the method in accordance with the present invention.
Figure 13:
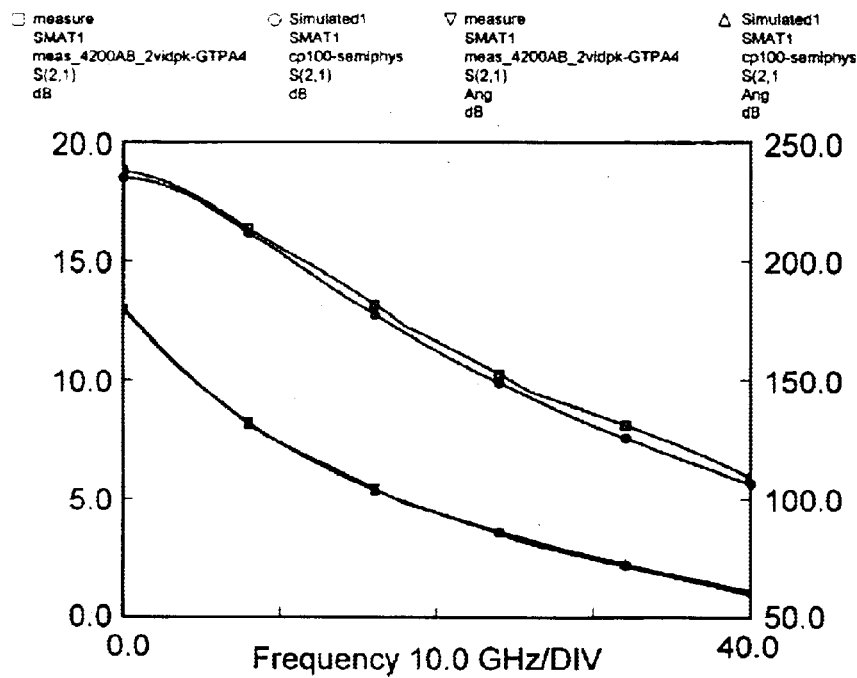
FIG. 13 is similar to FIG. 12 and illustrates the measured vs. modeled values for the S21 parameter.
Figure 14:
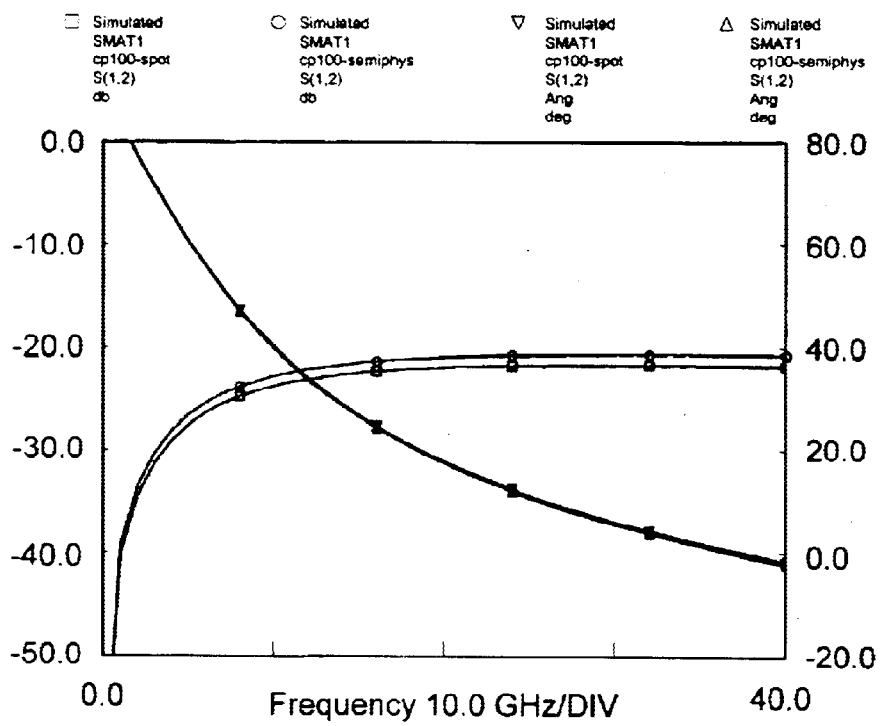
FIG. 14 is similar to FIG. 12 but for the S12 S-parameter.

As shown in FIGS. 12, 13 and 14, the modeled results that are simulated using the semi-physically derived equivalent circuit model very accurately replicate the measured high frequency, S-parameter data.

Figure 15:
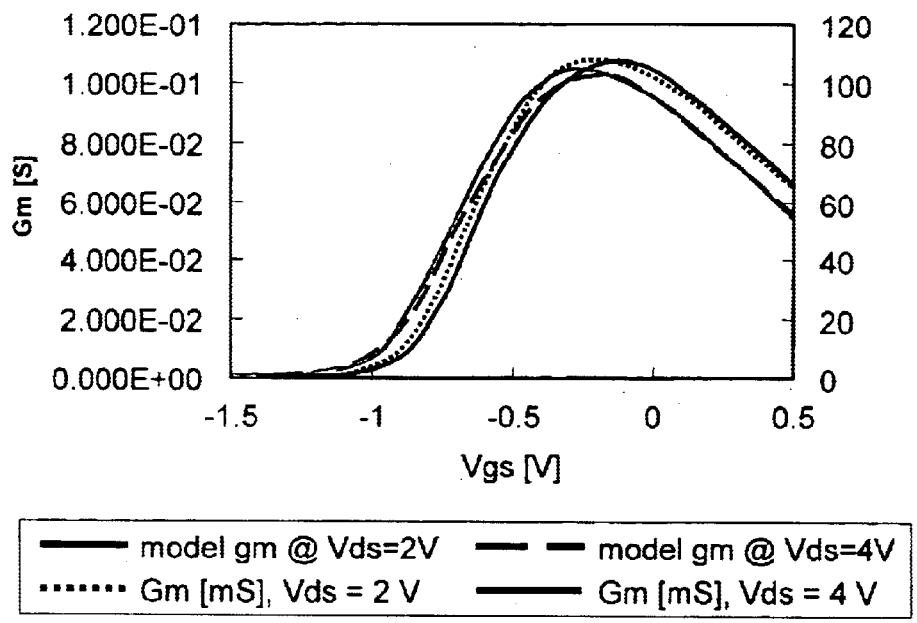
FIG. 15 is a graphical illustration of the semi-physically modeled vs measured small signal Gm.

The following equations represent the small-signal excitation derivation of a small-signal equivalent circuit modeled Gm. FIG. 15. illustrates the semi-physically simulated bias equations of the small signal Gm compared to measured data.

| Description | Symbol | Unit | Expression |
|---|---|---|---|
| Semi-Physically Modeled Drain-Source Current Control | $I_{ds}$ | [A] | $= g_{ch} V_{ds}(1 + \lambda V_{ds})/[1 + (V_{ds}/V_{sate})^m]^{1/m}$ |
| Small-Signal Determination of equiv. Circuit Gm value | $g_{mRF}$ | [S] | $= dI_{ds}/d(V_{gs} - V_{sAcc})$ |
| Source-Access voltage drop | $V_{SAcc}$ | [V] | $= I_{dsW}*(R_{SUndepCap} + R_{SAccess} + R_{SBoundary} + R_{probeS}/W_g)$ |
| Fine Extrinsic Saturation Voltage | $V_{sate}$ | [V] | $= I_{satcom}/g_{ch}$ |
| Extrinsic Conductance of the Linear Region, Under the gate | $g_{ch}$ | [S] | $= g_{chi}/[1 + g_{chi}(R_S + R_d)]$ |
| Intrinsic Conductance of the Linear Region, Under the gate | $g_{chi}$ | [S] | $= (q N_s \mu_{ave} W_g)/L_g$ |

Figure 16:
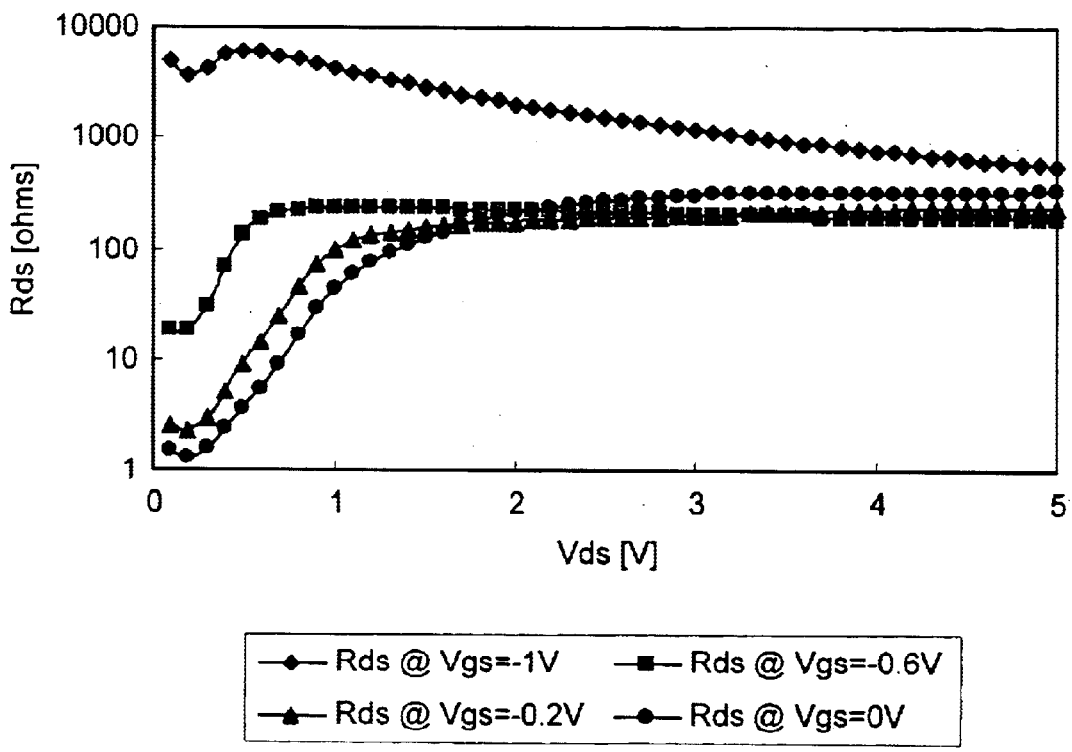
FIG. 16 is a graphical illustration of the semi-physically simulated bias dependence of the small-signal output conductance Rds.

The following equations represent the small-signal excitation derivation of Rds. FIG. 16 illustrates the semi-physically simulated bias-dependence of the small-signal Rds.

| Description | Symbol | Unit | Expression |
|---|---|---|---|
| Small-Signal Determination of equiv. Circuit Rds value | $R_{ds}$ | [Ω] | $= 1/g_{dsRF}$ |
| | $g_{dsRF}$ | [S] | $= \{dI_{ds}/d(V_{ds} - R_{probeD} * I_{ds} - V_{sAcc} - V_{dAcc} V_{dSat})\} *r_{dsF}$ |
| Drain-Access voltage drop | $V_{DAcc}$ | [V] | $= I_{dsW}*(R_{DundepCap} + R_{DUndepRec} + R_{DAccess} + R_{probeD}/W_g)$ |
| Drain-Saturated Region voltage drop | $V_{DSAT}$ | [V] | $= I_{dsW}*(R_{DSaturated})$ |
| External Test probe or lead resistance | $R_{probeD}$ | [Ω] | |
| High Frequency conductance dispersion factor | $r_{dsF}$ | [] | $= (RF_{rdsF} + 1)* \tanh(10 *|V_{ds} - V_{th}|) + 1$ |
| High Frequency conductance dispersion | $RF_{rdsF}$ | [] | |

Figure 17:
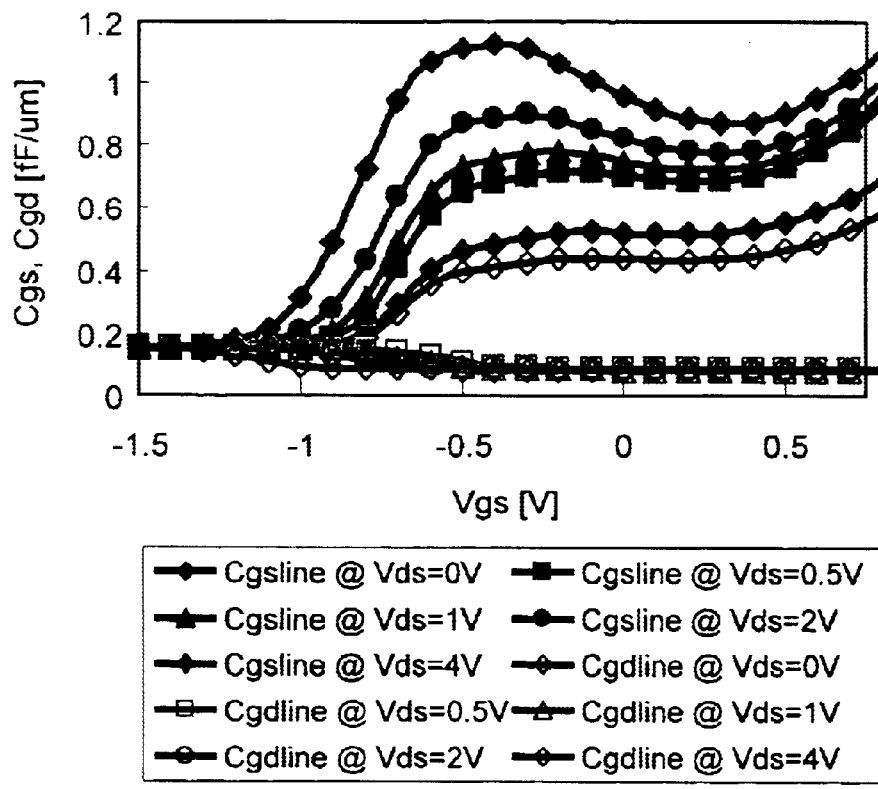
FIG. 17 is a graphical illustration of the semi-physically simulated bias dependence of the small signal gate-source and gate-drain capacitance Cgs and Cgd.

The following equations may be used for the small-signal excitation derivation of Cgs and Cgd. FIG. 17 illustrates the semi-physically simulated bias-dependence of the small-signal Cgs and Cgd.

| | | | |
|---|---|---|---|
| Small-Signal Determination of equiv. Circuit Cgs value | $C_{gs}$ | [fF/$\mu$m] | $= C_{gsf} + \beta C_{gcTot} L_{gs} *$ $\{1 - [(V_{saten} - V_{dse})/(2*V_{saten} - V_{dse})]^2\}$ |
| | $C_{gd}$ | [fF/$\mu$m] | $= C_{gdf} + \beta C_{gcTot} L_{gd} *$ $\{1 - [V_{saten}/(2*V_{saten} - V_{dse})]^2\}$ |
| Parasitic Gate-Source Fringing Capacitance | $C_{gsf}$ | [fF/$\mu$m] | $= Cg_{surf} C_{f\text{-}form1} SiNF + Cgsf_{Source} + Cgsf_{Pad}$ |
| Parasitic Gate-Source Fringing Capacitance | $C_{gdf}$ | [fF/$\mu$m] | $= Cg_{surf} C_{f\text{-}form1} SiNF + Cgdf_{Cap} + C_{gdf} Pad$ |
| Total Specific Gate-Channel Capacitance | $C_{gcTot}$ | [fF/$\mu$m] | $= C_{gc} + C_{gcdonor}$ |
| Specific Gate-Channel Capacitance | $C_{gc}$ | [fF/$\mu M^2$] | $= c_{gc} Msh_{Kchan}/$ $\{[1 + (N_s'/(N_0 + N_{maxOc})^{\gamma c})^{(1+1/\gamma c)}]\}$ |
| Effective Drain-Source Voltage Control | $V_{dse}$ | [V] | $= V_{ds}/[1 + (V_{ds}/V_{saten})^m]^{1/m}$ |
| Specific Gate-Donor Layer Accumulation Capacitance | $C_{gcdonor}$ | [fF/$\mu$m$^2$] | $= q\, dN_{sDonor}/dV_{gs}$ |
| Ideal Specific Gate-Channel Capacitance | $c_{gc}$ | [fF/$\mu$m$^2$] | $= q dN_s'/dV_{gs}$ |
| Empirical Parasitic Donor Charge Control Expression | $N_{sDonor}$ | [cm$^{-2}$] | $= (N_s' + N_s)*(d_1 + \Delta d_1) Msh_{Kpar} * V_{gte}/$ $(d_1 + \Delta d_1)$ |
| Fringing capacitance to surface of source-access region | $C_{gsurf}$ | [fF/$\mu$m] | |
| Empirical Fringing capacitance-bias shaping expression | $C_{f\text{-}form1}$ | [] | $= \{1 - \tanh[KC_{fK(Vgs)} - VC_{fOn} + V_{ds} MC_{fl})]\}/2$ |
| Fringing capacitance to source-access region | $C_{gsfSource}$ | [fF/$\mu$m] | |
| Fringing capacitance to source metal pads | $C_{gsfPad}$ | [fF/$\mu$m] | |
| Fringing capacitance to drain-access Capped Region | $C_{gdfCap}$ | [fF/$\mu$m] | |
| Fringing capacitance to drain metal pads | $C_{gdfPad}$ | [fF/$\mu$m] | |
| Dielectric Coating Thickness Factor | SiNF | [] | |
| Specific Gate-Channel Capacitance Bias ModificationFactor | $Msh_{Kcahn}$ | [] | |
| Donor Charge Bias Modification Factor | $Msh_{Kcahn}$ | [] | |
| Empirical Specific Charge Control Shaping Parameter | $_\gamma C$ | [] | |

Figure 18:
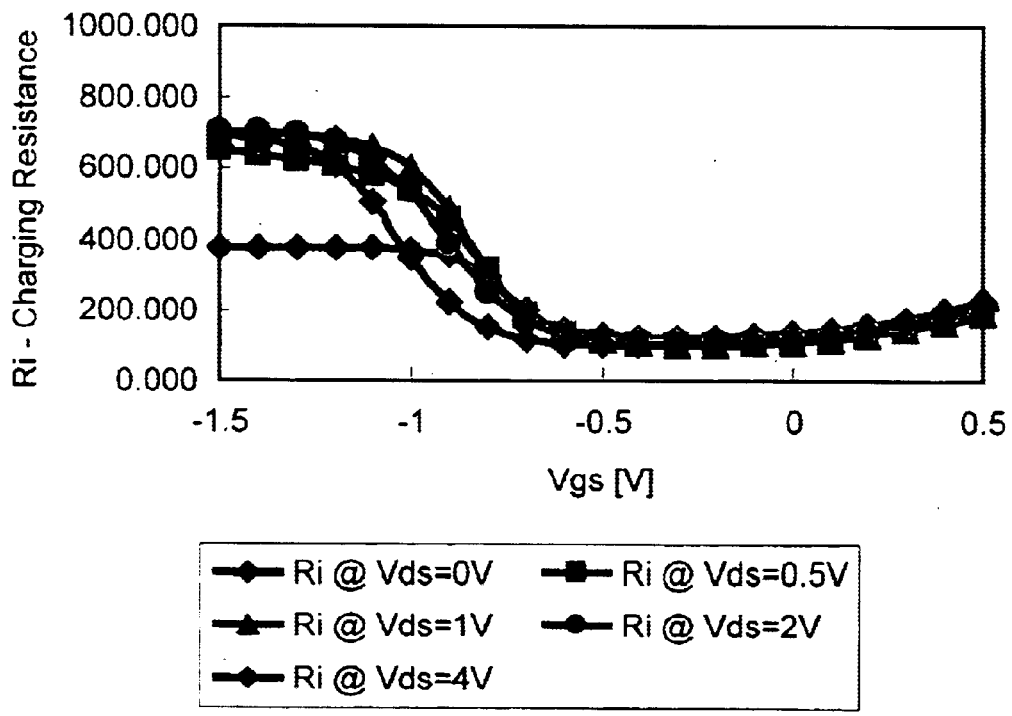
FIG. 18 is a graphical illustration of the semi-physically simulated bias-dependence of the small signal gate source charging resistance Ri.

The following equations are involved in the small-signal excitation derivation of Ri. FIG. 18, which follows, shows the semi-physically simulated bias-dependence of the small-signal Ri.

MMIC LNA amplifier is replicated through microwave circuit simulation using small signal and noise equivalent circuits that were generated by the semi-physical model. The results of the measured and modeled results are shown below in Table 5. As seen from these results, the semi-physical device model was able to accurately simulate the measured bias-dependent performance, even though the bias variation was quite wide.

| | | | |
|---|---|---|---|
| Gate-Source Non-quasistatic charging resistance | $R_{icharge}$ | [$\Omega*\mu$m] | $= L_{gs2} W_g/[C_{gsChan} W_g v_s]$ |
| Gate-Channel Source Capacitance | $C_{gsChan}$ | [fF/$\mu$m] | $= C_{gsf} + \beta C_{gc} L_{gs} *$ $\{1 - [V_{saten} - V_{dse})/(2*V_{saten} - V_{dse})]^2\}$ |

Figure 19:
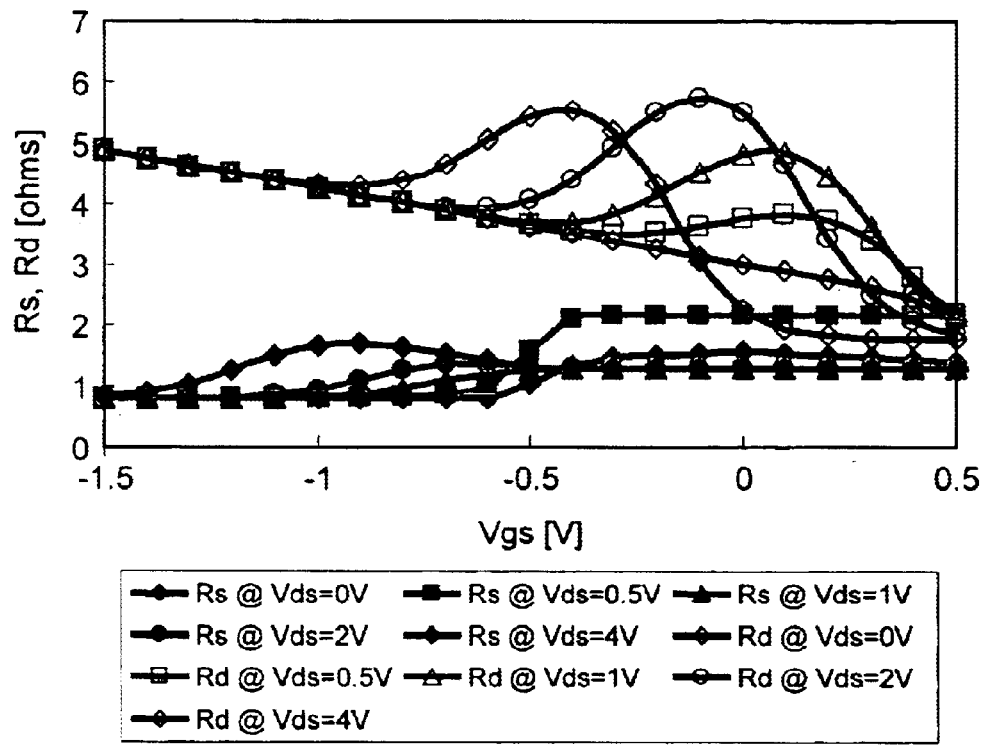
FIG. 19 is a graphical illustration of the semi-physically bias dependence of the small signal source and drain resistance Rs and Rd.

FIG. 19 below shows the semi-physically simulated bias-dependence of the on-mesa parasitic access resistances, Rs and Rd.

Example of Semi-Physical Model and Bias-Dependence Small-Signal Source and Drain Resistance, RS AND RD The following example verifies how the semi-physical small-signal device model is able to provide accurate projections for bias-dependent small-signal performance. In this example, the same semi-physical device model as used in the previous examples was used because the example MMIC circuit was fabricated utilizing the same HEMT device technology.

In this example, the bias-dependence small-signal gain and noise performance of a two-stage balanced K-band

TABLE 5

Measured vs. Modeled Gain NF and Gain @ 23.5 Ghz for K-band MMIC LNA at Difference Bias Conditions

| Bias Condition | Measured Gain @ 23.5 GHz | Predicted Gain @ 23.5 GHz | Measured NF @ 23.5 GHz | Predicted NF @ 23.5 GHz |
|---|---|---|---|---|
| Vds = 0.5 V 112 mA/mm | 15.2 dB | 15.8 dB | 2.97 dB | 2.77 dB |
| Vds = 1.0 V 112 mA/mm | 20.6 dB | 21.0 dB | 2.29 dB | 2.20 dB |
| Vds = 2.0 V 112 mA/mm | 19.8 dB | 20.2 dB | 2.25 dB | 2.15 dB |
| Vds = 3.0 V 112 mA/mm | 18.9 dB | 19.1 dB | 2.30 dB | 2.11 dB |
| Vds = 3.5 V 112 mA/mm | 18.4 dB | 18.5 dB | 2.34 dB | 2.18 dB |

TABLE 5-continued

Measured vs. Modeled Gain NF and Gain @ 23.5 Ghz for
K-band MMIC LNA at Difference Bias Conditions

| Bias Condition | Measured Gain @ 23.5 GHz | Predicted Gain @ 23.5 GHz | Measured NF @ 23.5 GHz | Predicted NF @ 23.5 GHz |
|---|---|---|---|---|
| Vds = 4.0 V 112 mA/mm | 18.0 dB | 18.0 dB | 2.37 dB | 2.27 dB |
| Vds = 2.0 V 56 mA/mm | 16.4 dB | 18.0 dB | 2.45 dB | 2.21 dB |
| Vds = 2.0 V 170 mA/mm | 21.4 dB | 20.9 dB | 2.38 dB | 2.21 dB |
| Vds = 2.0 V 225 mA/mm | 22.2 dB | 21.0 dB | 2.65 dB | 2.6 dB |
| Vds = 3.0 V 225 mA/mm | 21.4 dB | 20.3 dB | 2.71 dB | 2.61 dB |
| Vds = 3.0 V 170 mA/mm | 20.5 dB | 20.0 dB | 2.42 dB | 2.22 dB |
| Vds = 4.0 V 170 mA/mm | 19.6 dB | 19.2 dB | 2.50 dB | 2.29 dB |

Figure 20:
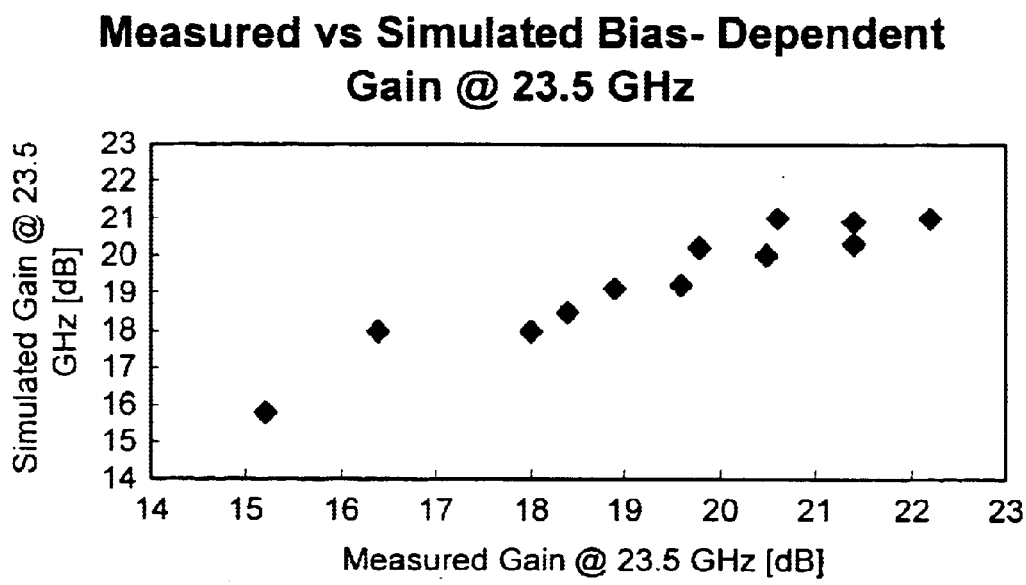
FIG. 20 is a graphical illustration of the measured vs modeled bias dependent gain at 23.5 Ghz for a K-band MMIC amplifier.

A plot of measured vs. modeled gain for the values listed in Table 5, above, is shown in FIG. 20.

The following example verifies how the semi-physical small-signal device model is able to provide accurate projections for physically dependent small-signal performance. In this example, the same semi-physical device model as used in the previous examples was used.

In this example, physical process variation was input into the semi-physical device model in terms of statistical variation about known averages, cross-correlation, and standard deviations. The goal of this exercise was to replicate the measured DC and small-signal device variation. The degree of accurate replication indicates the degree to which the semi-physical model is physically accurate.

Table 6 below lists the simulated, and known process variation that was used:

TABLE 6

Statistical Process Variation Model

| Parameter | Nominal | Standard Dev. |
|---|---|---|
| Gate Length | 0.15 μm | 0.01 μm |
| Gate-Source Recess | 0.16 μm | 0.015 μm |
| Gate-Drain Recess | 0.24 μm | 0.020 μm |
| Etch Depth | 780 Å | 25 Å |
| Pass. Nitride Thickness | 750 Å | 25 Å |
| Gate-Source Spacing | 0.7 μm | 0.1 μm |
| Source-Drain Spacing | 1.8 μm | 0.15 μm |

In the course of microelectronic component production, sample devices are tested in process in order to gain statistical process control monitor (PCM) data. FIGS. 21A and 21B show schematically the kind of data that is extracted and recorded from measured device I-V's during PCM testing.

Figure 23:
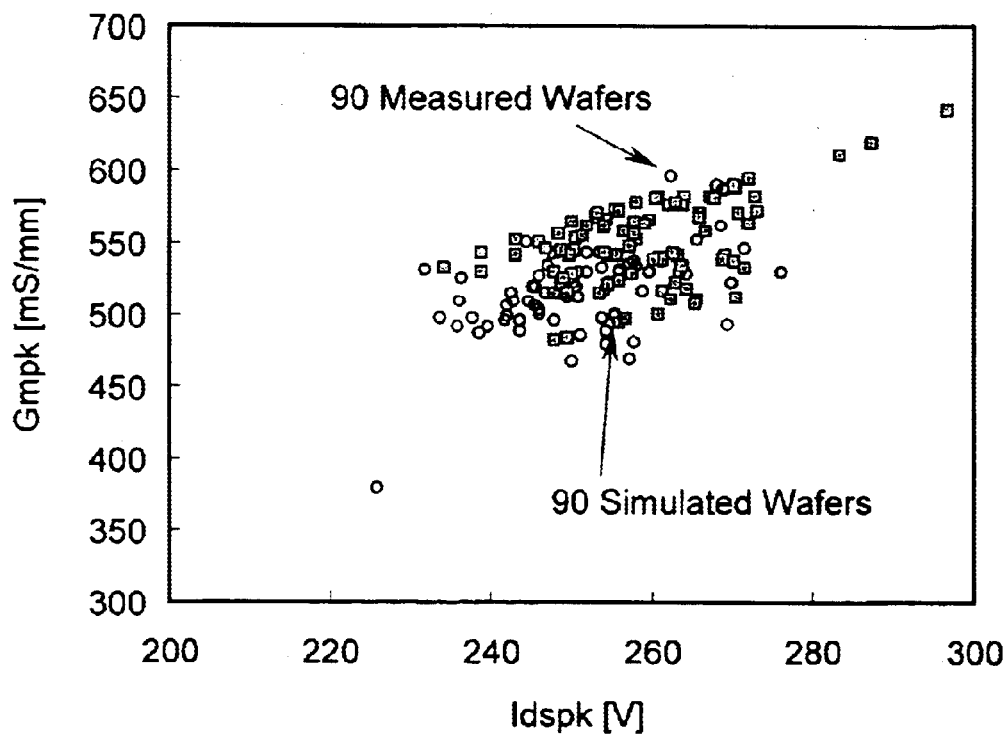
FIG. 23 is a graphical illustration of the measured vs semi-physically simulated process variation for Idpk and Gmpk.
Figure 24:
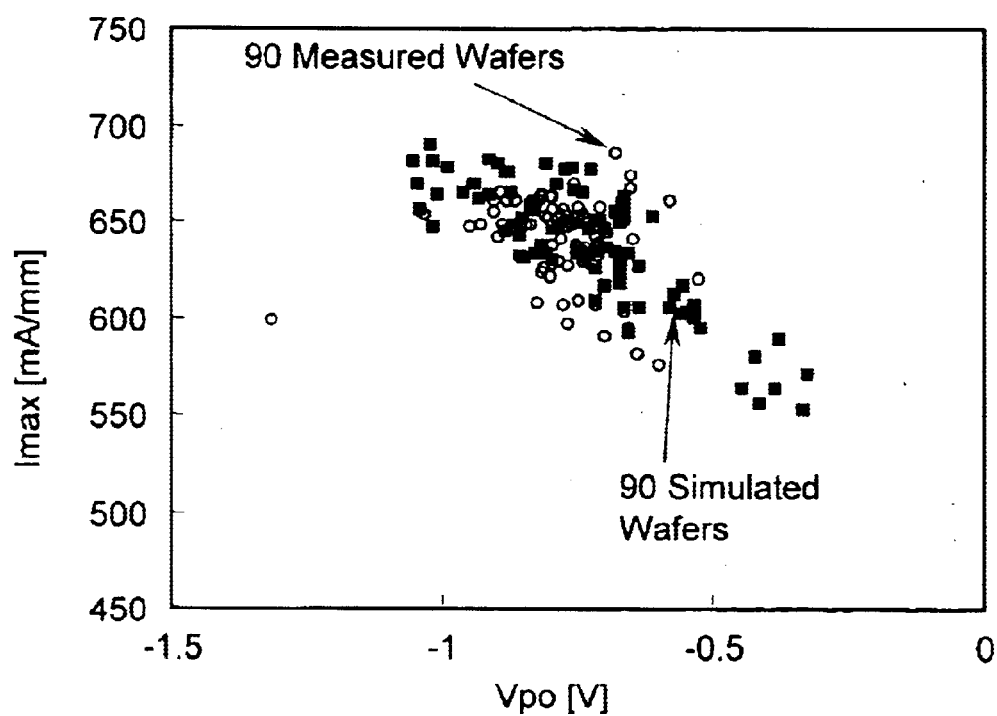
FIG. 24 is a graphical illustration of the measured vs semi-physically simulated process variation for Imax and Vpo.

Since the semi-physical device model is able to simulate I-V's, it was able to simulate the variation of I-V's due to physical process variation. These I-V's were analyzed in the same fashion to extract the same parameters that are recorded for PCM testing. FIGS. 22, 23, and 24 show how accurately the simulated results match with measured process variation. FIG. 19 shows how the semi-physically simulated Vgpk and Gmpk match with actual production measurements. FIG. 20 shows how simulated Idpk and Gmpk match, also. Finally, FIGS. 21A and 21B show how the simulated Imax and Vpo also match very well.

Small-signal S-parameter measurements are also taken in process for process control monitoring. These measurements are used to extract simple equivalent circuit models that fit the measured S-parameters. Since the semi-physical device model is able to simulate these equivalent circuit models, it was able to simulate the variation of model parameters due to physical process variation.

Figure 25:
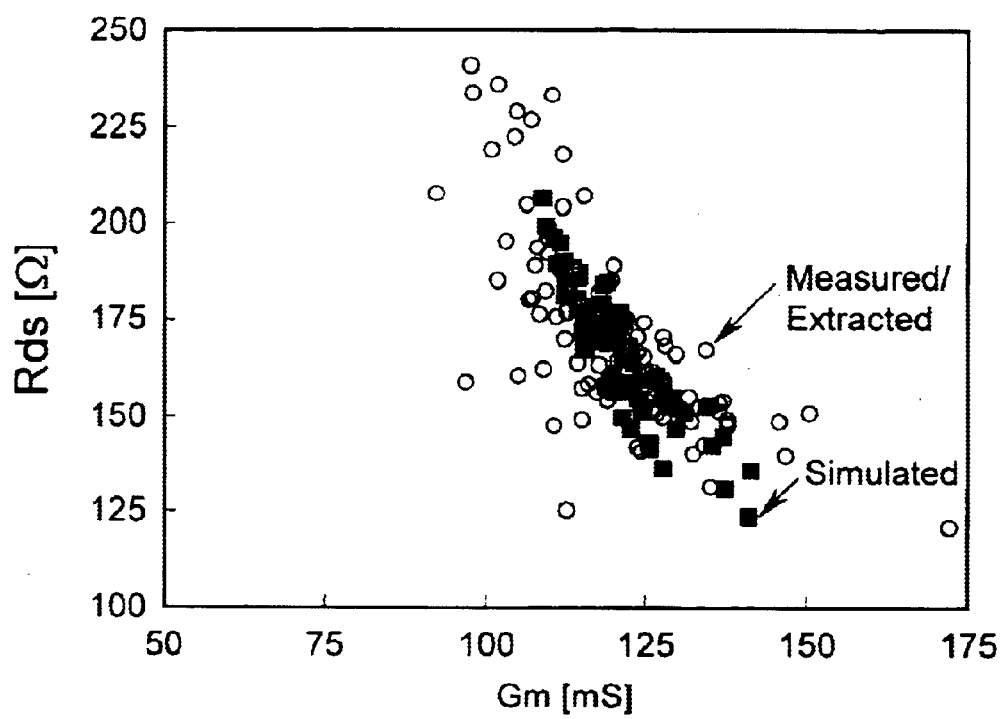
FIG. 25 is a graphical illustration of the measured/extracted vs semi-physically simulated process variation for the small signal equivalent model Rds and Gm.
Figure 26:
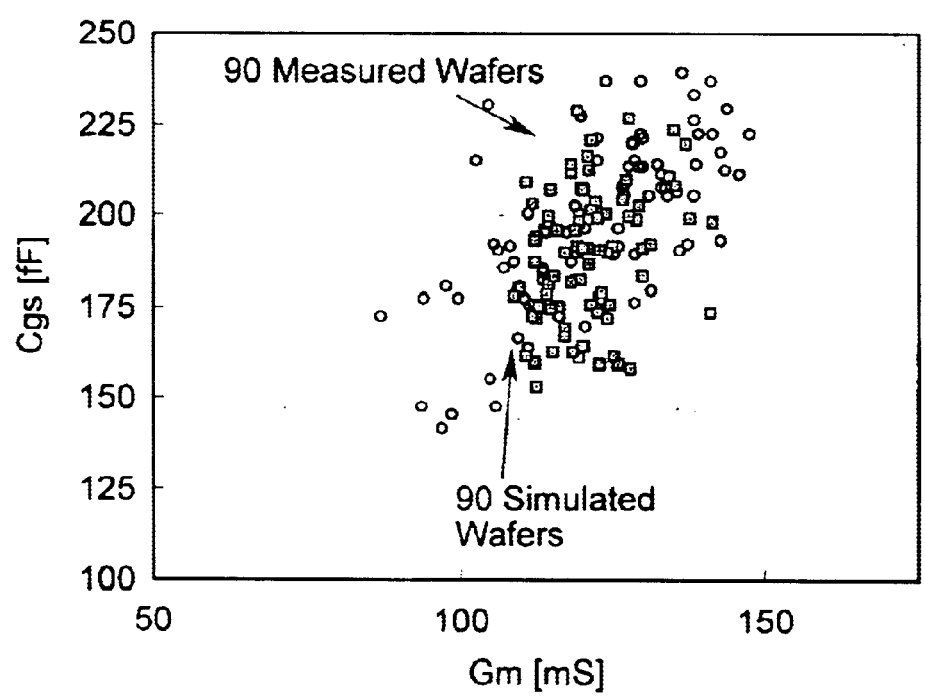
FIG. 26 is a graphical illustration of the measured/extracted vs semi-physically simulated process variation for the small signal equivalent model Cgs and Gm.
Figure 27:
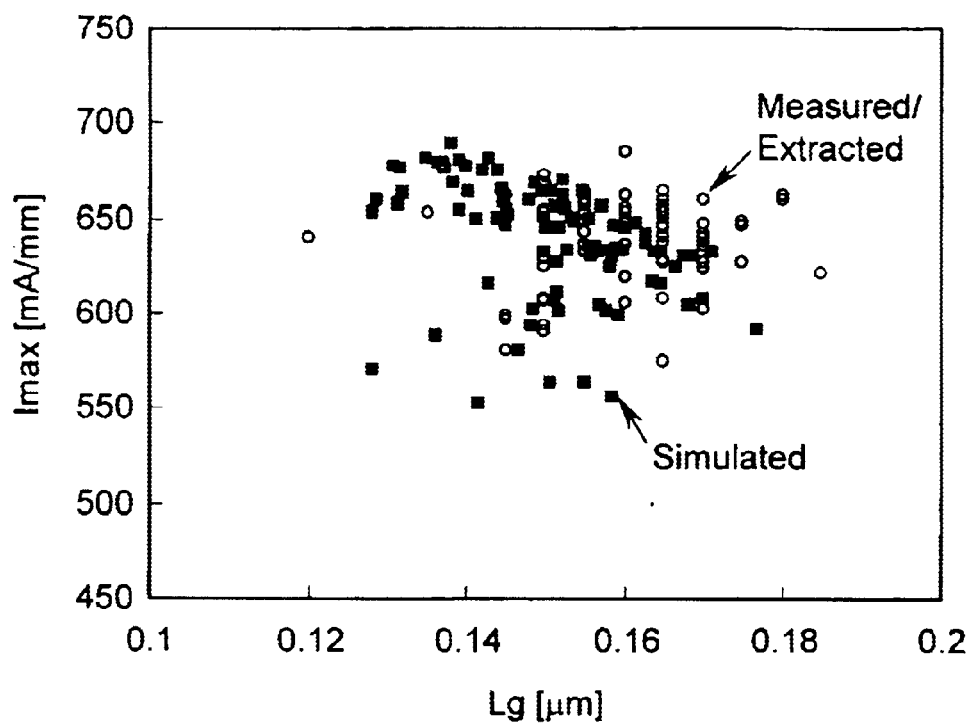
FIG. 27 is a graphical illustration of the measured vs semi-physically simulated physical dependence for Imax as a function of physical gate length.
Figure 28:
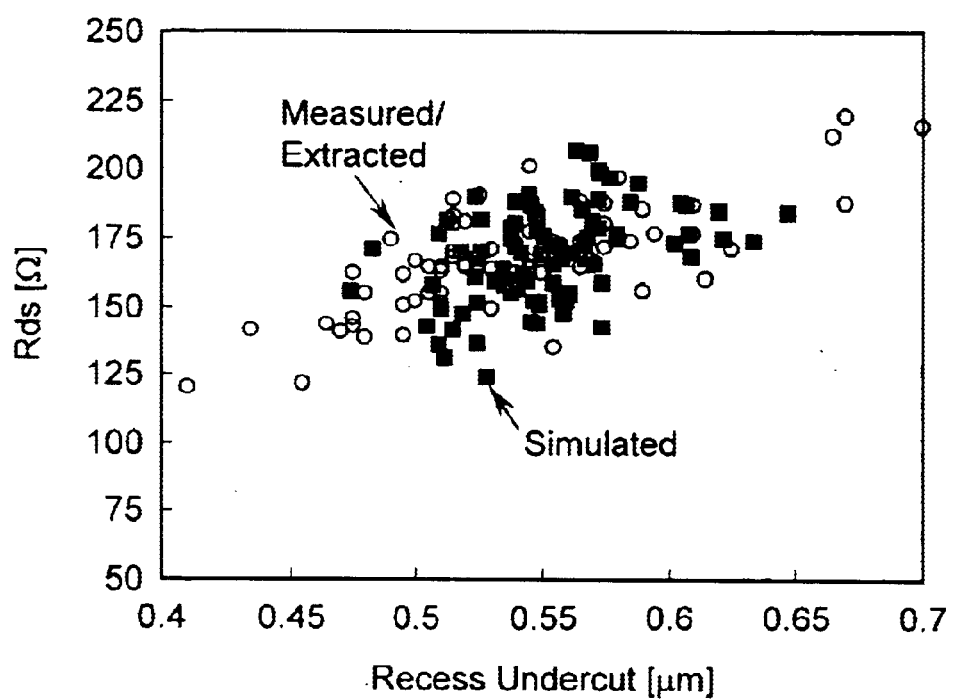
FIG. 28 is a graphical illustration of the measured/extracted model vs semi-physically simulated physical dependence for Rds as a function of physical recess undercut width.

FIGS. 25, and 26 show how accurately the simulated results match with measured/extracted process variation for the small-signal model parameters. FIG. 25 shows how the semi-physically simulated Rds and Gm match very well with actual extracted model process variation More direct and convincing evidence supporting the accurate, physical nature of the semi-physical model can be shown be comparing the dependence of simulated and measured performance to real physical variable. As shown in FIG. 27, the semi-physical model is able to very accurately reproduce the dependence of Imax upon gate length. In addition, the semi-physical model is also able to replicate physical dependence for high-frequency small-signal equivalent circuits. This is shown in FIG. 28, which shows that it is able to reproduce the dependence of Rds with Recess undercut width.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A method of modeling a semiconductor device comprising the steps of:
    a) modeling a small signal electrical equivalent circuit for said semiconductor device which includes a plurality of electrical circuit elements defining a small signal model, said small signal equivalent circuit based in part on one or more real process parameters;
    b) deriving said electrical circuit elements at least in part from a small signal excitation analysis of at least one of the intrinsic charge and electrical field characteristics of said semiconductor device, wherein said real process parameters include at least one of: gate length recess, etch depth, recess undercut dimensions and passivation nitrite thickness.

2. The method as recited in claim 1, wherein said real process parameters further include: gate-source recess, gate-drain recess, gate-source spacing and source-drain spacing.

3. The method as recited in claim 1, wherein step (b) includes the step of:
    (c) determining the relationships between one or more conduction band offsets and electrical permitivities and the material composition for the materials in the semiconductor device.

4. The method as recited in claim 3, wherein said semiconductor device model is based at least in part as a function of one or more of: conduction band offsets; electrical permitivities; and material composition of the epi stack.

5. The method as recited in claim 3, wherein said semiconductor device is a high electron mobility transistor (HEMT).

6. The method as recited in claim 3, wherein said semiconductor device is a field effect transistor (FET).

7. The method as recited in claim 3, wherein step (c) is determined analytically.

8. The method as recited in claim 7, wherein step (c) is determined by fitting simulated data.

9. The method as recited in claim 3, further including step (d); determining the electron transport characteristics of any bulk materials in the semiconductor device.

10. The method as recited in claim 9, further including step (e); determining an undepleted linear channel mobility.

11. The method as recited in claim 10, wherein step (e) is determined by material characterization.

12. The method as recited in claim 10, wherein step (e) is determined by physical simulation.

13. The method as recited in claim 10, further including step (f) determining the Schottky barrier height expressions.

14. A method of modeling a semiconductor device comprising the steps of:
(a) modeling a small signal on an electrical equivalent circuit for said semiconductor device with a plurality of electrical circuit elements defining a small signal model;

deriving said electrical circuit elements from a small signal excitation analysis of the intrinsic charge within said semiconductor device by determining the relationships between one or more of the conduction band offsets and electrical permitivities and the material composition for the materials in the semiconductor device;

determining the electron transport characteristics of any bulk materials in the semiconductor device;

determining an undepleted linear channel mobility;

forming semiconductor physical equations with empirical terms for modeling one or more of the following characteristics: fundamental-charge control physics for sheet charge in an active channel as controlled by a gate terminal voltage; average centroid position of the sheet charge within the active channel width; position of charge partitioning boundaries as a function of gate, drain and source terminal voltages; bias dependence of linear channel mobility and surface depleted regions; bias dependence of a velocity saturating electric field of the channel; saturated electron velocity; electrical conductance within the linear region of the channel, under the gate; electrical conductance within the source and drain access regions.

15. The method as recited in claim 14, further including step (i):
adjusting the empirical terms of the semi-physical equations to fit the model current-voltage (I-V) characteristics relative to measured values.

16. The method as recited in claim 15, further including steps (j):
iteratively readjusting the empirical terms to achieve a simultaneous fit of measured capacitance voltage (C-V) and I-V characteristics.

* * * * *